United States Patent
Adachi

(10) Patent No.: US 7,262,662 B2
(45) Date of Patent: Aug. 28, 2007

(54) OPERATIONAL AMPLIFIER

(75) Inventor: Toshio Adachi, Yokohama (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 191 days.

(21) Appl. No.: 11/107,916

(22) Filed: Apr. 18, 2005

(65) Prior Publication Data

US 2005/0231284 A1    Oct. 20, 2005

(30) Foreign Application Priority Data

Apr. 19, 2004    (JP)    ............... 2004-123200

(51) Int. Cl.
*H03F 3/45*    (2006.01)
(52) U.S. Cl. ..................................... 330/259
(58) Field of Classification Search ................ 330/253, 330/259, 261
See application file for complete search history.

(56) References Cited

U.S. PATENT DOCUMENTS 6,064,262 A * 5/2000 Wang ......................... 330/253

FOREIGN PATENT DOCUMENTS

| JP | 02-231760 | 9/1990 |
|---|---|---|
| JP | 05-102756 | 4/1993 |
| JP | 11-088078 | 3/1999 |
| JP | 2001-284535 | 10/2001 |

OTHER PUBLICATIONS

Duque-Carrillo et al., "1-V Rail-to-Rail Operational Amplifiers in Standard CMOS Technology", IEEE Journal of Solid-State Circuits, vol. 35, No. 1, pp. 33-44, (2000).

* cited by examiner

*Primary Examiner*—Steven J. Mottola
(74) *Attorney, Agent, or Firm*—Finnegan, Henderson, Farabow, Garrett & Dunner, L.L.P.

(57) ABSTRACT

The present invention is a folded cascode operational amplifier provided with a differential input portion 10, cascode current source portion 20, current mirror portion 30, output portion 40, and differential amplifier 50 serving as a differential amplifying portion. The differential input portion 10 has P-type MOS transistors M2 and M3 of a differential pair for respectively inputting a differential signal and the MOS transistors M2 and M3 are respectively provided with a well terminal. The differential amplifier 50 compares the source voltage of each of the MOS transistors M2 and M3 with a predetermined reference voltage Vref, generates an output voltage in accordance with the comparison result, and supplies the generated output voltage to well terminals as well voltages of the MOS transistors M2 and M3. An operational amplifier is provided which performs the rail-to-rail operation at a low voltage and in which an input current is zero.

12 Claims, 14 Drawing Sheets

FIG. 10A

———— Vdd

▨▨▨ Vs1+Vthn
▨▨▨
▨▨▨ Vss

FIG. 10B

▨▨▨ Vdd
▨▨▨
▨▨▨ Vs2+Vthp

———— Vss

FIG. 10C

———— Vdd

———— Vss

FIG. 11A

———— Vdd
▨▨▨ Vs1+Vthn
▨▨▨
▨▨▨ Vss

FIG. 11B

▨▨▨ Vdd
▨▨▨
▨▨▨ Vs2+Vthp
———— Vss

FIG. 11C

———— Vdd
▨▨▨ Vs1+Vthn
▨▨▨ Vs2+Vthp
———— Vss

OPERATIONAL AMPLIFIER

FIELD OF THE INVENTION

The present invention relates to a folded cascode operational amplifier which performs the rail-to-rail operation even for a low-voltage power supply and in which input current is zero.

In this case, the rail-to-rail operation represents that the operation range of an input/output voltage always operates from a positive power supply to a negative power supply and "Rail to Rail" is the trade mark of Motorola, Inc.

BACKGROUND OF THE INVENTION

A power supply voltage which can be supplied to an LSI circuit (Large Scale Integrated circuit) is reduced because a recent process is miniaturized. A day on which only about 1 V can be supplied is near in future. Moreover, in recent years, a circuit has been requested which can operate even if the number of batteries is decreased because electronic equipment becomes portable.

Particularly, the above mentioned becomes a serious problem for an analog circuit for handling continuous signals. The representative of analog circuits is an operational amplifier. It is not too much to say that whether an operational amplifier can operate at a low voltage holds the key on advisability of change of an analog circuit to a low voltage.

FIG. 8 shows a conventional operational amplifier to be operated by a low-voltage power supply.

As shown in FIG. 8, this operational amplifier has a differential input portion 110 constituted of MOS transistors M101 to M103, a differential input portion 120 constituted of MOS transistors M104 to M106, a summing portion 130 constituted of MOS transistors M107 to M114, and an output portion 150 constituted of MOS transistors M115 and M116, a resistor R100, and a capacitor C100.

Moreover, the operational amplifier has a non-inversion input terminal 100, an inversion input terminal 101, bias terminals 102, 103, and 107 for supplying a bias voltage to gates of MOS transistors M103, M106, M113, M114, and M116 respectively operating as a current source, bias terminals 104 and 105 for supplying a bias voltage to gates of MOS transistors M109, M110, M111, and M112 respectively functioning as a cascode MOS transistor, and an output terminal 106.

In FIG. 8, a circuit constituted of the MOS transistors M104 to M116 omitting the MOS transistors M101 to M103 is a folded cascode operational amplifier using an N-type MOS transistor as an input transistor which has been well-known so far.

Moreover, in FIG. 8, a circuit constituted of the MOS transistors M101 to M103 and MOS transistors M107 to M116 omitting the MOS transistors M104 to M106 is a folded cascode operational amplifier using a P-type MOS transistor as an input transistor which has been well-known so far.

Therefore, the operational amplifier in FIG. 8 can be regarded as a circuit constituted by combining a folded cascode operational amplifier using a P-type MOS transistor as an input transistor and a folded cascode operational amplifier using an N-type MOS transistor as an input transistor.

In this case, when taking out the folded cascode operational amplifier using the P-type MOS transistor as an input transistor from the operational amplifier shown in FIG. 8, the circuit shown in FIG. 9 is obtained. In FIG. 9, 140A denotes a cascode power supply portion and 140B denotes a current mirror portion.

Then, the operation of the operational amplifier shown in FIG. 8 is described below.

In general, a relation between input voltage Vin of an N-type MOS transistor and current Ids flowing between a drain and a source can be shown by the following expression.

$$Ids = (W/L) \cdot \mu \cdot Cox(Vin - Vs1 - Vthn)^2 \quad (1)$$

In this case, W denotes the channel width of a MOS transistor (MOSFET), L denotes the channel length of the transistor, $\mu$ denotes mobility, Cox denotes the capacity for unit area, Vs1 denotes the source voltage of the MOS transistor, Vthn denotes a threshold voltage.

According to the expression (1), no current flows unless the input voltage Vin has a value larger than Vs1+Vthn in the case of an N-type MOS transistor. That is, in this case, the N-type MOS transistor is turned off and normal operation cannot be performed.

Similarly, a relation between input voltage Vin of a P-type MOS transistor and current Ids flown through the P-type MOS transistor is shown by the following expression.

$$Ids = (W/L) \cdot \mu \cdot Cox(Vs2 + Vthp - Vin)^2 \quad (2)$$

In this case, W denotes the channel width of a MOS transistor, L denotes the channel length of the transistor, $\mu$ denotes mobility, Cox denotes the electrostatic capacity for unit area, Vs2 denotes the source voltage of the MOS transistor, and Vthp denotes a threshold voltage.

According to the expression (2), no current flows unless the input voltage Vin has a value smaller than Vs2+Vthp in the case of a P-type MOS transistor. In the case of the enhancement type PMOS which is normally used, the symbol of Vth is negative.

Then, in the case of the operational amplifier shown in FIG. 8, an input signal voltage and an operable range are described below by referring to FIGS. 10A to 10C.

In FIGS. 10A to 10C, Vss denotes a lower (low-potential side) power supply voltage and Vdd denotes an upper (high-potential side) power supply voltage. The hatched portion in FIG. 10A shows that an N-type MOS transistor does not operate and the hatched portion of FIG. 10B shows that a P-type MOS transistor does not operate. Moreover, in the case of FIG. 10C, a hatched portion is formed in a range in which the N-type MOS transistor or P-type MOS transistor does not operate. However, because either of the N-type MOS transistor and P-type MOS transistor operates without fail, in accordance with FIGS. 10A and 10B, an input signal always operates from a positive power supply to a negative power supply.

Then, an operation range when lowering by a power supply voltage without changing the sum (Vth+Vs) of the threshold voltage Vth and source voltage Vs of a MOS transistor is described by referring to FIGS. 11A to 11C.

The hatched portion of FIG. 11A shows a portion where an N-type MOS transistor does not operate and the hatched range of FIG. 11B shows a portion where a P-type MOS transistor does not operate. Because both power supply voltages are lowered compared to the case of FIGS. 10A to 10C, not-hatched portions where a transistor can operate are decreased though the widths of hatched portions are the same. FIG. 11C shows the range in which the both do not operate by the hatched portion. This range in which the both do not operate is formed at a portion close to the center of the power supply voltage.

Therefore, when the sum of threshold values of the P-type and N-type MOS transistors exceeds the power supply voltage, it is impossible to operate an operational amplifier.

To solve the above problem, it is also considered to lower the threshold value, for example, make the threshold voltage Vthn negative and realize the so-called depletion type.

In this case, however, the Vs1 serving as a source voltage becomes higher than the input voltage Vin as understood from the expression (1). When the input voltage is equal to or close to the power supply voltage Vdd, no operation can be performed because the source voltage becomes higher than the power supply voltage Vdd. That is, in FIG. 10A, a hatched portion, that is, a region where no operation is performed is formed at the power supply voltage Vdd side, the operation region of operational amplifier is not improved even if changing the symbol of the threshold voltage Vthn.

Moreover, it is considered that operation is actually performed by setting the threshold voltage Vthn to a value close to zero. However, control of the absolute value of the threshold voltage Vthn is not easy and fluctuation of ±0.1 to 0.2 actually occurs. Furthermore, because the threshold voltage Vthn is fluctuated by temperature, a method of setting the threshold voltage Vthn to zero is not a realistic solution.

Therefore, to solve the above trouble, a method of securing an operation range by using a level shifter circuit is proposed in "J. Francisco Duque-Carrilo, L. Ausin Torelli, Jose M. Valverde, Miguel A. Dominguez, IEEE Journal of Solid-State Circuits, Vol. 35, No. 1, January 2000, p. 33".

Moreover, a method of widening the dynamic range of an operational amplifier by controlling a well potential is disclosed in JP5-102756A.

However, the method in the above document has a problem that input current is not zero. When there is input current, it is impossible to apply the method to a switched capacitor circuit or it is necessary to add a resistance to an input terminal like the case of a bipolar circuit. When the resistance value is large, a problem occurs that offset becomes large. Moreover, when the resistance value is small, the resistance of the whole circuit is restricted to a small value and an operational amplifier to be used has a trouble that a capacity for driving the small resistance is applied.

However, the method according to the above patent gazette has a problem that the well potential can select only the binary value of either of source potential and power supply. Therefore, a threshold value to be realized through control is only a binary value and the versatility of the obtained threshold value is narrow. Moreover, a switching control signal for selecting is necessary, a trouble occurs that the application of operational amplifier is restricted.

Therefore, it is an object of the present invention to provide an operational amplifier which performs the rail-to-rail operation even for a low-voltage power supply and in which input current is zero.

SUMMARY OF THE INVENTION

An aspect of the present invention is provided with a differential input portion including a differential pair of MOS transistors for inputting a differential signal respectively and a current source for supplying a constant current to the MOS transistors, each of the MOS transistors having a well terminal, a load portion comprising a MOS transistor pair which operates as the load of the differential pair of MOS transistors, and a well voltage control portion for controlling the well voltage of the differential pair of the MOS transistors to keep being constant a source voltages of the differential pair of MOS transistors, the well voltage control portion supplying each of the well terminal with an output signal generated in accordance with comparison result compared source voltages of the differential pair of MOS transistors with a predetermined reference voltage.

Another aspect of the present invention is provided with a first differential input portion including a first differential pair of MOS transistors for inputting a differential signal respectively and a first current source for supplying a constant current to the first differential pair of the MOS transistors, each of the MOS transistors having a well terminal, a second differential input portion including a second differential pair of MOS transistors for inputting the differential signal and a second current source for supplying a constant current to the second differential pair of MOS transistors, the polarity of the second differential pair of MOS transistors being opposite to the polarity of the first differential pair of MOS transistors, a summing portion for summing a current from the first differential input portion and a current from the second differential input portion, and a well voltage control portion for controlling the well voltage of the first differential pair of the MOS transistors to keep being constant a source voltages of the first differential pair of MOS transistors, the well voltage control portion supplying each of the well terminal with an output signal generate in accordance with comparison result compared the source voltage of the differential pair of the MOS transistors with a predetermined reference voltage.

Still another aspect of the present invention is provided with a first differential input portion including a first differential pair of MOS transistors for inputting a differential signal respectively and a first current source for supplying a constant current to the first differential pair of the MOS transistors, each of the first differential pair of MOS transistors having a well terminal, a second differential input portion including a second differential pair of MOS transistors for inputting the differential signal and a second current source for supplying a constant current to the second differential pair of MOS transistors, the polarity of the second differential pair of MOS transistors being opposite to the polarity of the first differential pair of MOS transistors, each of the second differential pair of MOS transistors having well terminal, a summing portion for summing a current from the first differential input portion and a current from the second differential input portion, and a first well voltage control portion for controlling the well voltage of the first differential pair of the MOS transistors to keep being constant a source voltages of the first differential pair of MOS transistors, the well voltage control portion supplying each of the well terminal of the first differential pair of the MOS transistors with an output signal generated in accordance with comparison result compared the source voltage of the first differential pair of the MOS transistors with a predetermined first reference voltage, and a second well voltage control portion for controlling the well voltage of the second differential pair of the MOS transistors to keep being constant a source voltages of the second differential pair of MOS transistors, the well voltage control portion supplying each of the well terminal of the second differential pair of the MOS transistors with an output signal generated in accordance with comparison result compared the source voltage of the second differential pair of the MOS transistors with a predetermined second reference voltage.

Still another aspect of the present invention is provided with a differential input portion including a differential pair of MOS transistors for inputting a differential signal respectively and a current source for supplying a constant current to the MOS transistors, each of the MOS transistors having a well terminal, a first cascode current source portion including a MOS transistor pair constituting a folded cascode circuit with the differential pair of MOS transistors, first current source and second current source supplying a constant current to the MOS transistor pair respectively, and a second cascode current source portion including a third current source and fourth current source supplying a constant current to the MOS transistor pair of the first cascode current source portion respectively, and a well voltage control portion for controlling the well voltage of the differential pair of the MOS transistors to keep being constant a source voltages of the differential pair of MOS transistors, the well voltage control portion supplying each of the well terminal with an output signal generated in accordance with comparison result compared the source voltage of the differential pair of the MOS transistors with a predetermined reference voltage.

Still another aspect of the present invention is provided with a first differential input portion including a first differential pair of MOS transistors for inputting a differential signal respectively and a current source for supplying a constant current to the MOS transistors, each of the MOS transistors having a well terminal, a second differential input portion including a second differential pair of MOS transistors for inputting the differential signal and a second current source for supplying a constant current to the second differential pair of MOS transistors, the polarity of the second differential pair of MOS transistors being opposite to the polarity of the first differential pair of MOS transistors, a summing portion which includes a first MOS transistor pair constituting a first folded cascode circuit with the first differential pair of MOS transistors, a third current source and a fourth current source supplying a constant current to the first MOS transistor pair respectively, a second MOS transistor pair constituting a second folded cascode circuit with the second differential pair of MOS transistors, and a fifth current source and a sixth current source supplying a constant current to the second MOS transistor pair respectively and in which the first MOS transistor pair constituting the first cascode circuit is connected with the second MOS transistor pair constituting the second cascode circuit in series, and a well voltage control portion for controlling the well voltage of the first differential pair of the MOS transistors to keep being constant a source voltages of the first differential pair of MOS transistors, the well voltage control portion supplying each of the well terminal with an output signal generated in accordance with comparison result compared the source voltage of the differential pair of the MOS transistors with a predetermined reference voltage.

Still another aspect of the present invention is provided with a first differential input portion including a first differential pair of MOS transistors for inputting a differential signal respectively and a first current source for supplying a constant current to the first differential pair of MOS transistors, each of the first differential pair of MOS transistors having a well terminal, a second differential input portion including a second differential pair of MOS transistors for inputting the differential signal and a second current source for supplying a constant current to the second differential pair of MOS transistors, the polarity of the second differential pair of MOS transistors being opposite to the polarity of the first differential pair of MOS transistors, the second differential pair of MOS transistors having a well terminal, a summing portion which includes a first MOS transistor pair constituting a first folded cascode circuit with the first differential pair of MOS transistors, a third current source and a fourth current source supplying a constant current to the first MOS transistor pair respectively, a second MOS transistor pair constituting a second folded cascode circuit with the second differential pair of MOS transistors, and a fifth current source and a sixth current source supplying a constant current to the second MOS transistors pair respectively and in which the first MOS transistor pair constituting the first cascode circuit is connected with the second MOS transistor pair constituting the second cascode circuit in series, and a first well voltage control portion for controlling the well voltage of the first differential pair of the MOS transistors to keep being constant a source voltages of the first differential pair of MOS transistors, the well voltage control portion supplying each of the well terminal of the first differential pair of the MOS transistors with an output signal generated in accordance with comparison result compared the source voltage of the first differential pair of the MOS transistors with a predetermine first reference voltage, and a second well voltage control portion for controlling the well voltage of the second differential pair of the MOS transistors to keep being constant a source voltages of the second differential pair of MOS transistors, the well voltage control portion supplying each of the well terminal of the second differential pair of the MOS transistors with an output signal generated in accordance with comparison result compared the source voltage of the second differential pair of the MOS transistors with a predetermined second reference voltage.

It is possible to form either of a set of the third current source and the fourth current source and a set of the fifth current source and the sixth current source into a current mirror configuration.

Moreover, the well voltage control portion comprises a differential amplifying portion and an output circuit and it is possible to supply a voltage higher than the positive voltage supplied to a portion other than the output circuit or a voltage lower than the negative voltage supplied to a portion other than the well voltage control portion.

It is possible to generate a voltage which is supplied to the well voltage control portion by a step-up circuit or step-down circuit.

In the case of the present invention constituted of the above configuration, a well voltage control portion controls well voltages of a differential pair of MOS transistors of a differential input portion so that source voltages of the MOS transistors become constant and thereby, it is possible to variably control threshold voltages of the MOS transistors.

Therefore, according to the present invention, an operational amplifier can be obtained which performs the rail-to-rail operation even for a low-voltage power supply, that is, the operating range of an input/output voltage always operates from a positive power supply to a negative power supply and in which input current is zero.

BRIEF DESCRIPTION OF THE DRAWING

FIGS. 10A to 10C are illustrations showing input operation ranges of a conventional operational amplifier;

FIGS. 11A to 11C are illustrations showing input operation ranges of a conventional operational amplifier;

DETAIL DESCRIPTION OF THE INVENTION

Embodiments of the present invention are described below by referring to the accompanying drawings.

First Embodiment

A configuration of first embodiment of an operational amplifier of the present invention is described below by, referring to FIG. 12.

Figure 12:
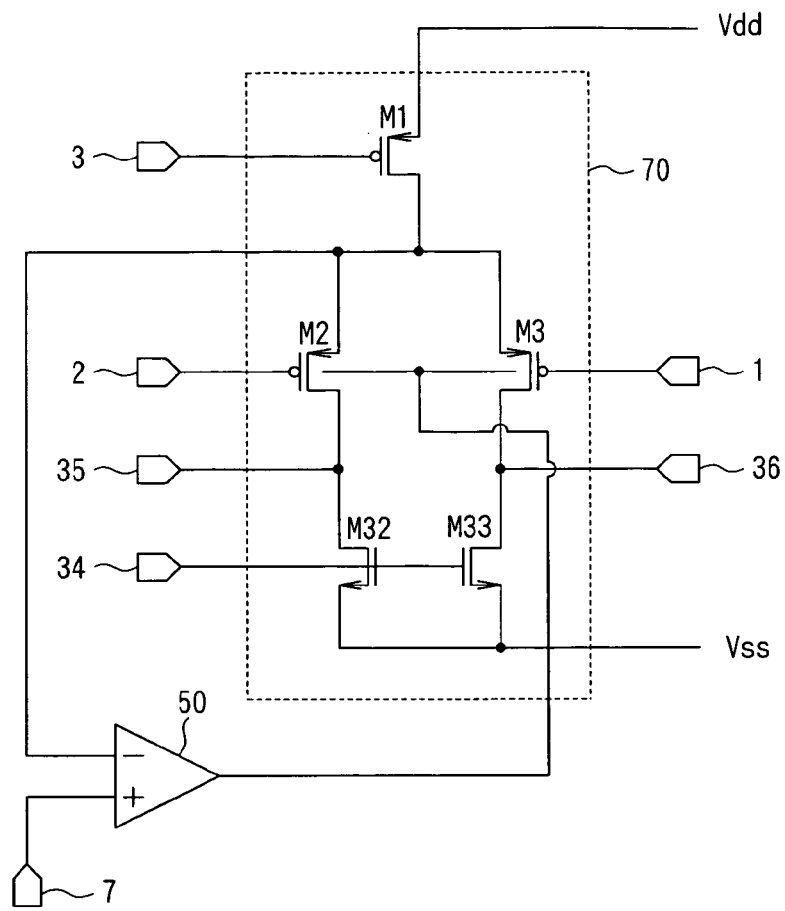
FIG. 12 is a circuit diagram showing a configuration of first embodiment of an operational amplifier of the present invention.

As shown in FIG. 12, the operational amplifier of the first embodiment is provided with a differential amplifying portion 70 for inputting a differential signal to perform differential amplification of the signal and a differential amplifier 50 serving as a well voltage control portion.

The differential amplifying portion 70 is provided with P-type MOS transistors M2 and M3 of a differential pair for respectively inputting a differential signal, P-type MOS transistor M1 functioning as a current source for supplying a constant current to the MOS transistors M2 and M3 and N-type MOS transistors M21 and M22 functioning as current sources for supplying constant currents to the MOS transistors M2 and M3 and functioning as loads of the MOS transistors M2 and M3.

The MOS transistors M2 and M3 are respectively provided with a well terminal and when an output voltage is supplied to the well terminals from the differential amplifier 50, well voltages of the MOS transistors M2 and M3 are controlled.

The differential amplifier 50 compares source voltages of the MOS transistors M2 and M3 with a predetermined reference voltage Vref, generates an output voltage in accordance with the comparison result, and supplies the generated output voltage to the well terminals as well voltages of the MOS transistors M2 and M3.

Moreover, a configuration of the first embodiment is described below by referring to FIG. 12.

The gate of one-hand MOS transistor M2 constituting a differential pair is connected to a non-inversion input terminal 2 so that a non-inversion input signal is input to the gate. Moreover, the gate of the other-hand MOS transistor M3 is connected to an inversion input terminal 1 so that an inversion input signal is input to the gate.

Sources of the MOS transistors M2 and M3 are connected in common and the common connection portion is connected to the drain of the MOS transistor M1 and the negative input terminal of the differential amplifier 50. The drain of the MOS transistor M2 is connected to the drain of a MOS transistor M32 and connected to an inversion output terminal 35. Moreover, the drain of the MOS transistor M3 is connected to the drain of a MOS transistor 33 and connected to a non-inversion output terminal 36. Well terminals of the MOS transistors M2 and M3 are connected in common.

Source voltages of the MOS transistors M2 and M3 are supplied to the negative input terminal of the differential amplifier 50. Moreover, the positive input terminal of the differential amplifier 50 is connected with a reference voltage input terminal 7 and the predetermined reference voltage Vref is supplied to the positive input terminal. Moreover, the output voltage of the differential amplifier 50 is supplied to well terminals of the MOS transistors M2 and M3 and well voltages of the MOS transistors M2 and M3 are controlled by the output voltage.

The gate of the MOS transistor M1 is connected to a bias terminal 3 so that a predetermined bias voltage is applied to the gate. Moreover, the power supply voltage Vdd at the high potential side is supplied to the source of the MOS transistor M1.

Gates of the MOS transistors M32 and M33 are connected to a bias terminal 34 so that a predetermined bias voltage is applied to gates of the transistors M32 and M33. Moreover, sources of the MOS transistors M32 and M33 are connected in common and the power supply voltage Vss at the low-potential side is supplied to the common connection portion.

A specific circuit configuration of the differential amplifier 50 is the same as the configuration of a differential amplifying circuit 50 of second embodiment to be described later (refer to FIG. 3).

According to the first embodiment constituted of the above configuration, the well voltage control portion 50 controls well voltages of the MOS transistors M2 and M3 of a differential pair so that source voltages of the MOS transistors M2 and M3 of the differential pair become constant and thereby, threshold voltages of the MOS transistors M2 and M3 can be variably controlled.

Figure 13:
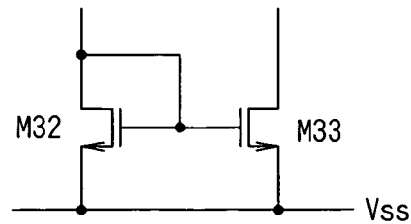
FIG. 13 is a circuit diagram of a modification of a load of the first embodiment.

In FIG. 12, a pair of MOS transistors M32 and M33 for respectively applying an optional bias voltage to a gate are used as loads of the MOS transistors M2 and M3. However, as shown in FIG. 13, it is also allowed to constitute the MOS transistors M32 and M33 by a current mirror circuit instead.

Second Embodiment

A configuration of second embodiment of the present invention is described below by referring to FIG. 1.

Figure 1:
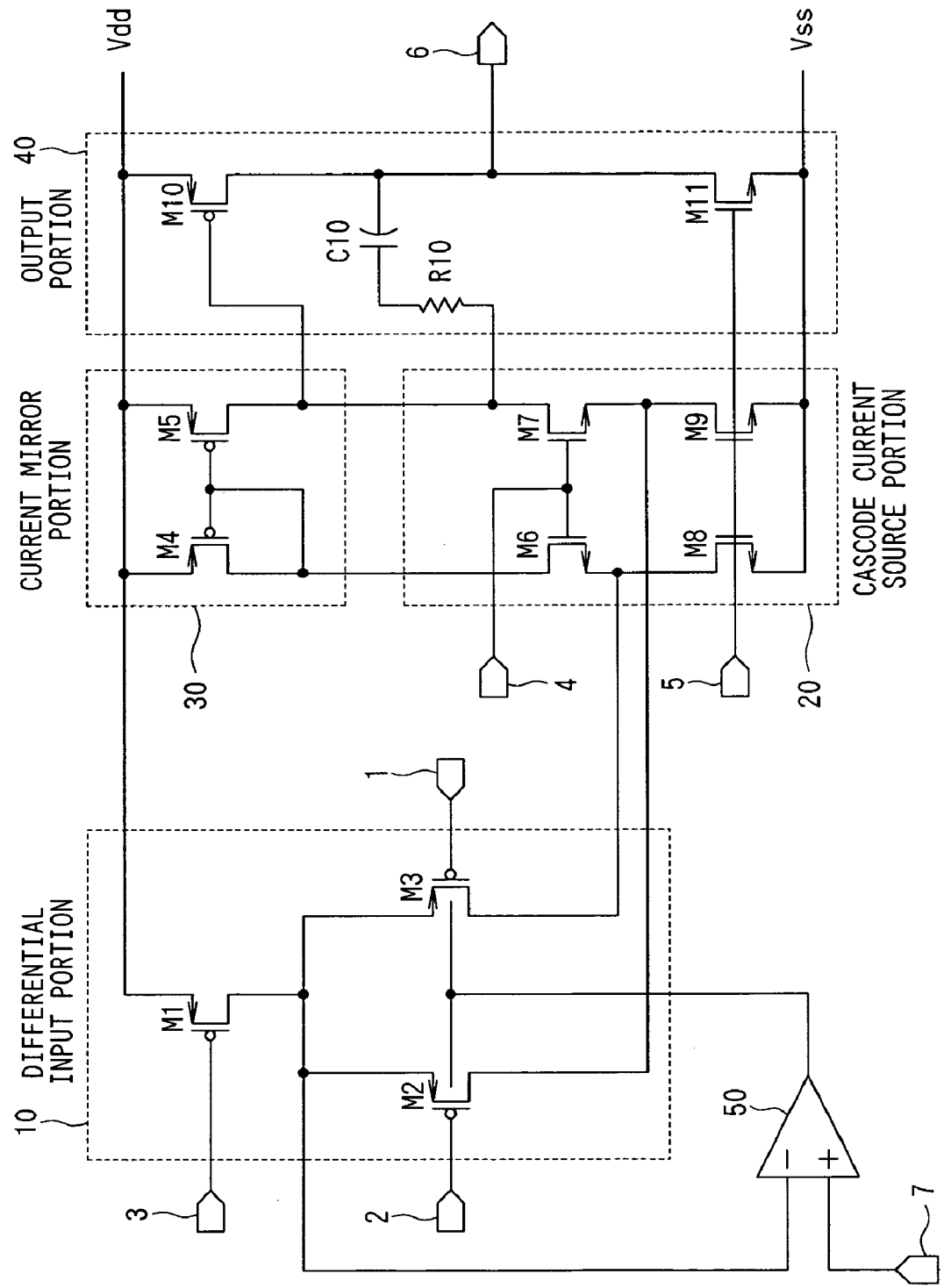
FIG. 1 is a circuit diagram showing a configuration of second embodiment of an operational amplifier of the present invention.

The operational amplifier of the second embodiment is a folded cascode operational amplifier which is provided with a differential input portion 10, a cascode current source portion 20, current mirror portion 30, output portion 40, and differential amplifier 50 serving as a well voltage control portion as shown in FIG. 1.

In this case, the second embodiment is obtained by using the first embodiment shown in FIG. 12 as the basic and developing the first embodiment into a folded cascode operational amplifier.

The differential input portion 10, cascode current source portion 20, and current mirror portion 30 constitute a folded cascode differential amplifying portion using a P-type MOS transistor as an input transistor.

The differential input portion 10 is provided with P-type MOS transistors M2 and M3 of a differential pair for inputting a differential signal and a P-type MOS transistor M1 functioning as a current source for supplying a constant current to the MOS transistors M2 and M3 of the differential pair. The MOS transistors M2 and M3 are respectively provided with a well terminal. When an output voltage is supplied to the MOS transistors M2 and M3 from the differential amplifier 50, well voltages of the MOS transistors M2 and M3 are controlled. Specific structures of the MOS transistors M2 and M3 will be described later.

The cascode current source 20 is provided with an N-type MOS transistor M6 constituting a folded cascode circuit with the MOS transistor M3, an N-type MOS transistor M7 constituting a folded cascode circuit with the MOS transistor M2, an N-type MOS transistor M8 functioning as a first current source for supplying a constant current to the MOS transistors M3 and M6, and an N-type MOS transistor M9 functioning as a second current source for supplying a constant current to the MOS transistors M2 and M7.

The current mirror 30 is provided with a MOS transistor M4 functioning as a first current source for supplying a constant current to the MOS transistor M6 and a MOS transistor M5 functioning as a second current source for supplying a constant current to the MOS transistor M7 and operates as the load of the differential input portion 10.

In the case of the output portion 40, a signal output from the cascode current source portion 20 (current mirror portion 30) is amplified by the P-type MOS transistor M10 using the N-type MOS transistor 11 as an active load and output. Moreover, as shown in FIG. 1, the output portion 40 includes a resistance R10 and capacitor C10 for performing phase compensation.

The differential amplifier 50 compares source voltages of the MOS transistors M2 and M3 with the predetermined reference voltage Vref, generates an output voltage in accordance with the comparison result, and supplies the generated output voltage to well terminals as well voltages of the MOS transistors M2 and M3.

Moreover, a configuration of the second embodiment is described below in detail.

As shown in FIG. 1, the gate of one-hand MOS transistor M2 constituting a differential pair is connected to the non-inversion input terminal 2 so that a non-inversion input signal is input to the gate. Moreover, the gate of the other-hand MOS transistor M3 constituting a differential pair is connected to the inversion input terminal 1 so that an inversion input signal is input to the gate.

Sources of the MOS transistors M2 and M3 are connected in common and the common connection portion is connected to the drain of the MOS transistor M1 and the negative input terminal of the differential amplifier 50. The drain of the MOS transistor M2 is connected with the source of the MOS transistor M7. The drain of the MOS transistor M3 is connected with the source of the MOS transistor M6. Well terminals of the MOS transistors M2 and M3 are connected in common.

Source voltages of the MOS transistors M2 and M3 are supplied to the negative input terminal of the differential amplifier 50. Moreover, the positive input terminal of the differential amplifier 50 is connected with the reference voltage input terminal 7 so that the predetermined reference voltage Vref is supplied to the positive input terminal of the differential amplifier 50. Moreover, the output voltage of the differential amplifier 50 is supplied to well terminals of the MOS transistors M2 and M3 so that well voltages of the MOS transistors M2 and M3 are controlled by the output voltage.

The gate of the MOS transistor M1 is connected to the bias terminal 3 so that a predetermined bias voltage is applied to the gate. Moreover, the high-potential-side power supply voltage Vdd is supplied to the source of the MOS transistor M1.

Gates of the MOS transistors M8 and M9 are connected to a bias terminal 5 so that a predetermined bias voltage is applied to the gates. Moreover, sources of the MOS transistors M8 and M9 are connected in common so that the low-potential-side power supply voltage Vss is supplied to the common connection portion. Furthermore, each of drains of the MOS transistors M8 and M9 is connected to each corresponding source of the MOS transistors M6 and M7.

Gates of the MOS transistors M6 and M7 are connected in common and the common connection portion is connected to a bias terminal 4 so that a predetermined bias voltage is applied to the gates. Each of drains of the MOS transistors M6 and M7 is connected to each corresponding drain of the MOS transistors M4 and M5 constituting a current mirror.

MOS transistors M4 and M5 constitute a current mirror. That is, gates of the MOS transistors M4 and M5 are connected in common and the common connection portion is connected to the drain of the MOS transistor M4. Moreover, sources of the MOS transistors M4 and M5 are connected in common and the power supply voltage Vdd is supplied to the common connection portion.

The gate of the MOS transistor M10 is connected to the common connection portion between the MOS transistors M5 and M7. Moreover, the power supply voltage Vdd is supplied to the source of the MOS transistor 10 and the drain of the MOS transistor 10 is connected to an output terminal 6.

The gate of the MOS transistor M11 is connected to the bias terminal 5 so that a predetermined bias voltage is applied to the gate. Moreover, the power supply voltage Vss is supplied to the source of the MOS transistor M11 and the drain of the transistor M11 is connected to the output terminal 6.

Moreover, a resistance R10 and a capacitor C10 are connected between the common connection portion between the MOS transistors M5 and M7 and the output terminal 6 in series and the series circuit forms a phase compensation circuit.

Then, structures of the P-type MOS transistors M2 and M3 used for the differential input portion 10 are described below.

Figure 2:
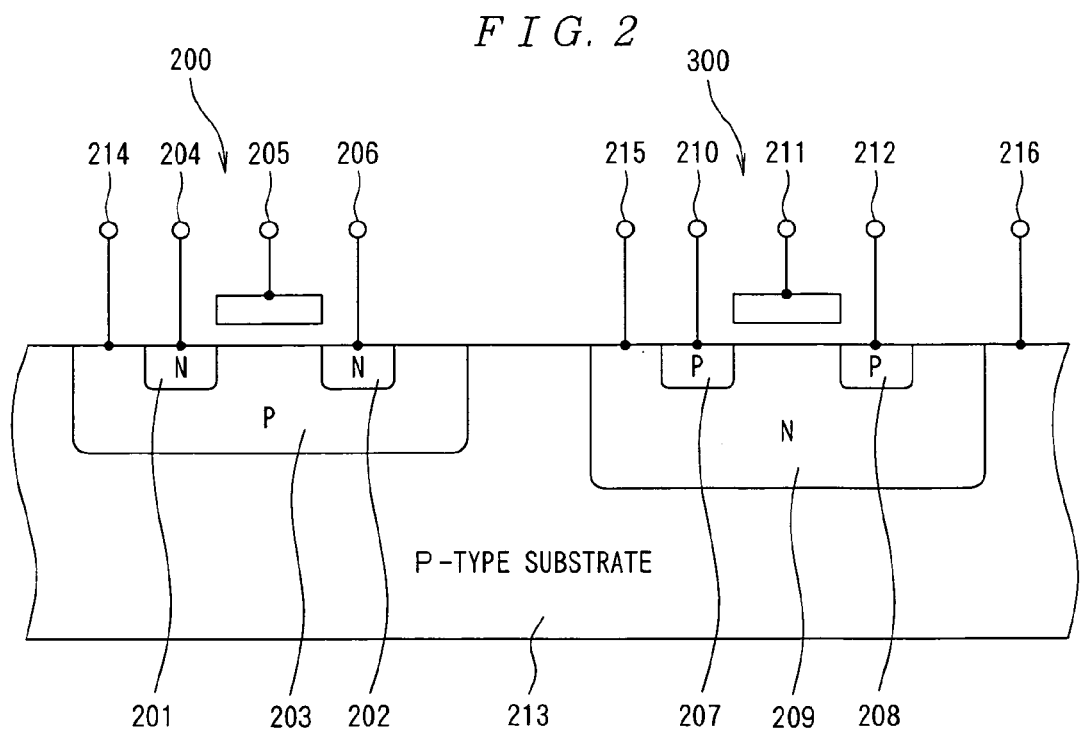
FIG. 2 is a sectional view for explaining a specific structure of a MOS transistor of the differential input portion shown in FIG. 1.

Because the P-type MOS transistors M2 and M3 can be realized by a CMOS circuit fabricated in the CMOS process of a widely-known P-type substrate, their structures are described by referring to FIG. 2.

As shown in FIG. 2, the CMOS circuit is constituted of an N-type MOS transistor 200 and P-type MOS transistor 300 formed on a P-type substrate 213.

In the case of the N-type MOS transistor 200, a P well 203 is formed in the P-type substrate 213 and an N-type region 201 serving as a source and an N-type region 202 serving as a drain are formed in the P well 203. The N-type region 201 is connected to a source electrode 204 and the N-type region 202 is connected to a drain electrode 206. Moreover, a gate is formed on the P-type substrate 213 and the gate is connected to a gate electrode 205. Furthermore, the P well 203 is connected to a well terminal 214.

In the case of the P-type MOS transistor 300, an N well 209 is formed in the P-type substrate 213 and a P-type region 207 serving as a source and a P-type region 208 serving as a drain are formed in the N well 209. The P-type region 207 is connected to a source electrode 210 and the P-type region 208 is connected to a drain electrode 212. Moreover, a gate is formed on the P-type substrate 213 and the gate is connected to a gate electrode 211. Furthermore, a gate is formed on the P-type substrate 213 and the gate is connected to the gate electrode 211. Furthermore, the N well 209 is connected to a well terminal 215.

In the case of the example in FIG. 2, the P-type substrate 213 is used. In recent years, however, it is frequent to use a P-type substrate though an N-type substrate can be also used instead of the P-type substrate 213.

In the following description, the substrate 213 is the P type. A voltage supply terminal 216 for supplying a voltage to the P-type substrate 213 is connected to the P-type substrate 213. The low-potential-side power supply voltage Vss is supplied to the voltage supply terminal 216 and 0 V is normally used.

In the case of FIG. 2, because the P well 203 of the N-type MOS transistor 200 uses a material same as a substrate, a P-well voltage is equal to the voltage of the P-type substrate. Therefore, it is impossible to set the P-well voltage to an optional voltage.

However, it is possible to supply an optional voltage in a range from the low-potential-side power supply voltage Vss to the high-potential-side power supply voltage Vdd as the voltage of the N well 209 of the P-type MOS transistor 300 unless a diode formed between a source 207 or a drain 208 and the N well 209 is turned on.

Therefore, the P-type MOS transistor 300 constituted of the structure shown in FIG. 2 can be used as the P-type MOS transistors M2 and M3 used for the differential input portion 10.

Then, in the case of the second embodiment constituted of the above configuration, a range of an operable input voltage is described in accordance with current-voltage characteristics of the P-type MOS transistors M2 and M3 constituted of a differential pair.

Because an operational amplifier is normally operated by feeding it back, voltages of the input terminals 1 and 2 are equalized by the effect of imaginary short. That is, currents flowing through the P-type MOS transistors M2 and M3 are the same. The expression same as the expression (2) can be used for current-voltage characteristics of the P-type MOS transistors M2 and M3 as described below.

$$Ids=(W/L)\cdot\mu\cdot Cox(Vs2+Vthp-Vin)^2 \quad (2)$$

In this case, w denotes the channel width of each of the MOS transistors M2 and M3, L denotes channel length of each of the transistors M2 and M3, μ denotes mobility, Cox denotes an electrostatic capacity for unit area, and Vs2 denotes the common source voltage of each of the MOS transistors M2 and M3. Vthp denotes the threshold voltage of each of the transistors M2 and M3.

In this case, the current value Ids becomes a constant value because a constant current is supplied by the MOS transistor M1 for a current source. The source voltage Vs2 of the MOS transistors M2 and M3 is shown by the following expression in accordance with the expression (2).

$$Vs2=Vin-Vthp+\Delta \quad (3)$$

In this case, $\Delta=\sqrt{\{Ids/(W/L)\cdot\mu\cdot Cox\}}$

From the expression (3), it is found that the source voltage Vs2 becomes a value obtained by subtracting the threshold voltage Vthp and Δ from the input voltage Vin. Because the enhancement type is normally used for a P-type MOS transistor, the symbol of Vthp is negative and the source voltage Vs2 becomes a value obtained by adding a constant value to an input voltage.

In this case, the threshold voltage Vthp is changed by a voltage Vbs between a well and a source. When showing a relation between threshold voltage Vthp and between-well-and-source voltage Vbs through first approximation, the following expression is obtained.

$$Vthp=Vthp0+\gamma\cdot Vbs \quad (4)$$

In this case, Vthp0 denotes a threshold voltage when a voltage between a well and a source is zero, Vbs denotes a voltage difference between the well and the source and γ denotes a constant which is positive in the case of a P-type MOS transistor.

In this case, the expression (4) conforms to the expression (3.87) on p. 118 of "Electronic Material Series Physics of VLSI Device" written by Seigou Kishino and Mitsumasa Koyanagi and issued by Maruzen Co., Ltd.

According to the expression (4), when the voltage of the well becomes higher than the voltage of the source, the threshold value Vthp is shifted in more negative direction. That is, in the expression (3), the shift value increases. However, when the voltage of the well becomes lower than the voltage of the source, the threshold value Vthp is shifted in the positive direction. That is, in the expression (3), there is a characteristic that the shift value decreases.

Then, a case is described in which the well voltage of the MOS transistor M2 shown in FIG. 1 is controlled by the differential amplifier 50.

The predetermined reference voltage Vref is supplied to the non-inversion input terminal of the differential amplifier 50. Moreover, the source voltage Vs2 of the MOS transistors M2 and M3 is supplied to the inversion input terminal of the differential amplifier 50. The output Vw of the differential amplifier 50 is shown by the following expression (5).

$$Vw=A(Vref-Vs2) \quad (5)$$

In this case, A denotes the gain of the differential amplifier 50.

When the source voltage Vs2 of the MOS transistors M2 and M3 is lower than the reference voltage Vref, the output voltage Vw of the differential amplifier 50 rises, according to the expression (5). That is, the well voltage becomes higher. Then, as described for the expression (4), the threshold voltage Vthp increases in more negative direction. The source voltage Vs2 is controlled so as to become higher in accordance with the expression (3).

However, when the source voltage Vs2 is lower than the reference voltage Vref, the output voltage Vw of the differential amplifier 50 lowers in accordance with the expression (5). That is, the well voltage becomes lower. Then, as described for the expression (4), the threshold voltage Vthp is controlled so that a negative value decreases and the source voltage Vs2 lowers in accordance with the expression (3).

As a result of the above control, the source voltage Vs2 always approaches the reference voltage Vref.

In this case, when the gain A of the differential amplifier 50 is high enough, voltages of the non-inversion input terminal and inversion input terminal of the differential amplifier 50 are equalized. That is, by the action of the differential amplifier 50 the input source voltage Vs2 of the MOS transistors M2 and M3 is controlled so as to become the reference voltage Vref which is always a constant value independently of the input voltage Vin shown in the expression (3).

For the MOS transistor M1 for a current source to normally function as a current source, it is only necessary that the between-drain-and-source voltage Vds1 satisfies the following expression (6).

$$Vds1 \geq Vgs1 - Vthp \quad (6)$$

In this case, Vgs1 is the between-gate-and-source voltage of the MOS transistor M1 and Vthp is the threshold voltage of the MOS transistor M1. That is, when setting the value of the reference voltage Vref to a value for the drain voltage of the MOS transistor M1 to satisfy the expression (6), the normal operation of the MOS transistor M1 for a current source can be secured.

Thus, even if any input voltage level is supplied to the input terminals 1 and 2 of the operational amplifier shown in FIG. 1, the operational amplifier can be normally operated. In other words, the operational amplifier can perform the rail-to-rail operation even at a power supply voltage lower than that of a conventional operational amplifier.

The output portion 40 shown in FIG. 1 is a widely-known output amplifying circuit constituted of the P-type MOS transistor M10 and N-type MOS transistor M11. In the case of the circuit having this configuration, an output voltage can operate in a wide range and the circuit preferably operates at a low voltage.

From the above mentioned, it can be said that the operational amplifier of the second embodiment can operate from lower side (low potential side) power supply voltage up to upper side (high potential side) power supply voltage for input and output voltages and perform the so-called rail-to-rail operation.

Moreover, the operational amplifier can operate at a voltage greatly lower than that of a conventional operational amplifier as long as the differential amplifier 50 for controlling a well voltage and the fluctuation of a threshold voltage are effective even if the power supply voltage lowers.

Furthermore, in the case of the second embodiment, input current is zero because the inversion input terminal 1 and non-inversion input terminal 2 are connected only with gates of the MOS transistors M2 and M3.

Figure 3:
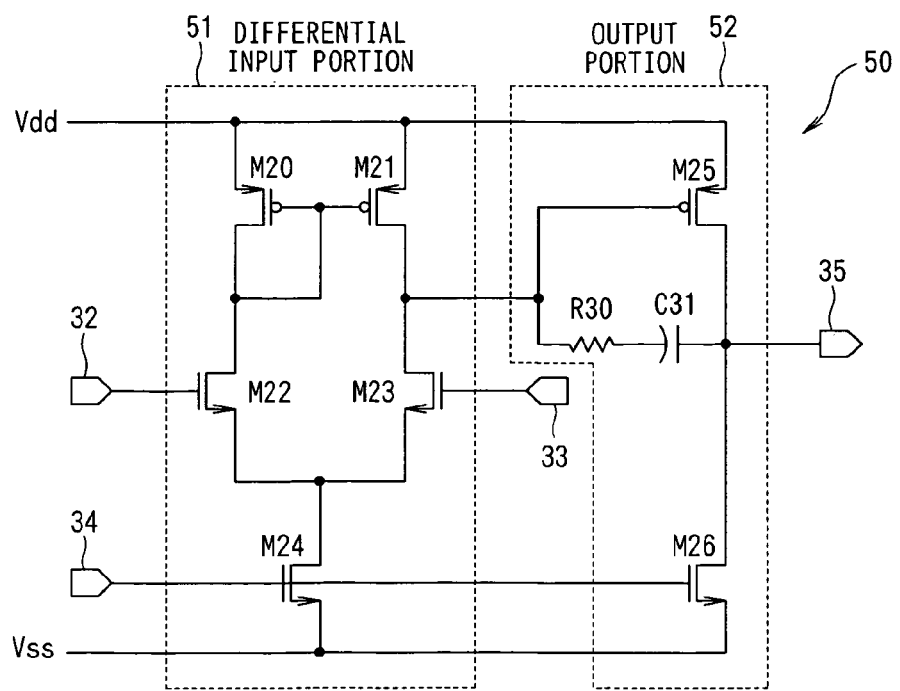
FIG. 3 is a circuit diagram showing a specific configuration of the differential amplifier shown in FIG. 1.

Then, a specific configuration of the differential amplifier 50 shown in FIG. 1 is described by referring to FIG. 3.

As shown in FIG. 3, the differential amplifier 50 is provided with a differential input portion 51 and output portion 52.

The differential input portion 51 is provided with an N-type MOS transistors M22 and M23 constituted of a differential pair for inputting a differential signal, P-type MOS transistors M20 and M21 constituting a current mirror circuit, and N-type MOS transistor M24 functioning as a current source.

The output portion 52 is constituted so that a signal output from the differential input portion 51 is amplified by a P-type MOS transistor M25 using an N-type MOS transistor M26 as an active load and output. Moreover, as shown in FIG. 3, the output portion 52 includes a resistance R30 and a capacitor C31 for performing phase compensation.

The output portion is further described below in detail. The gate of one-hand MOS transistor M22 constituting a differential pair is connected to an inversion input terminal 32 so that an inversion input signal is input to the gate. Moreover, the gate of the other-hand MOS transistor M23 constituting a differential pair is connected to a non-inversion input terminal 33 so that a non-inversion input signal is input to the gate.

Sources of the MOS transistors M22 and M23 are connected in common and their common connection portion is connected to the drain of the MOS transistor M24. Moreover, each of drains of the MOS transistors M22 and M23 is connected to each corresponding drain of the MOS transistors M20 and M21 constituting a current mirror.

The MOS transistors M20 and M21 constitute a current mirror. That is, gates of the MOS transistors M20 and M21 are connected in common and their common connection portion is connected to the drain of the MOS transistor M20. Moreover, sources of the MOS transistors M20 and M21 are connected in common so that the power supply voltage Vdd is supplied to their common connection portion.

The gate of the MOS transistor M24 is connected to the bias terminal 34 so that a predetermined bias voltage is applied to the gate. Moreover, the power supply voltage Vss is supplied to the source of the MOS transistor M24.

The gate of the MOS transistor M25 is connected to the common connection portion between the MOS transistors M23 and M21. Moreover, the power supply voltage Vdd is supplied to the source of the MOS transistor M25 and the drain of the transistor M25 is connected to the output terminal 35.

The gate of the MOS transistor M26 is connected to the bias terminal 34 so that a predetermined bias voltage is applied to the gate. Moreover, the power supply voltage Vss is supplied to the source of the MOS transistor M26 and the drain of the transistor M26 is connected to the output terminal 35.

Furthermore, the resistance R30 and capacitor C31 are connected between the common connection portion between the MOS transistors M23 and M21 and the output terminal in series and the series circuit forms a phase compensation circuit.

To design the operational amplifier of the second embodiment to be operated at a low voltage shown in FIG. 1, it is also necessary to operate the differential amplifier 50 which is one of components of the operational amplifier shown in FIG. 3 at a low voltage.

However, in the case of operations of the differential amplifier 50, because the input voltage is always the reference voltage Vref, it is not necessary to always operate the operation range of the input voltage from a positive power supply to a negative power supply. Moreover, in the case of the value of the reference voltage Vref, it is enough that the between-drain-and-source voltage of the MOS transistor M1 to be operated as the current source in FIG. 1 can be sufficiently secured.

When optimally designing the reference voltage Vref, it is allowed to set the reference voltage in a range of approx.

(Vdd-0.05) to (Vdd-0.3)V. Therefore, it is allowed that the differential amplifier 50 operates at a voltage in this range. Therefore, when using an N-type MOS transistor as the MOS transistor of the differential input portion 51 as shown in FIG. 3, it is possible to easily operate the differential amplifier 50.

Then, the effective range of operations of the second embodiment constituted of the above configuration is described below.

It is possible to control threshold voltages of the MOS transistors M2 and M3 in accordance with the expression (4). In fact, however, it is not easy to set source voltages of the MOS transistors M2 and M3 of the differential input portion 10 to the reference voltage Vref which is a constant value for all input voltages as shown in FIG. 1.

It is possible to control threshold values of the MOS transistors M2 and M3 by a well voltage as shown in the expression (4). However, when the constant $\gamma$ in the expression (4) has a high value, for example, a value of 3 or more, the above described operation can be realized.

Because the proportionality constant $\gamma$ to the potential difference Vbs between a well and a source is generally decided by the unit capacity of a gate oxide film and the impurity concentration of a well, a value of 3 or more can be realized. Because these parameters are decided from the current driving capacity, withstand-voltage performance, and various performances which are important performances of a MOS transistor, a slightly high $\gamma$ can be realized by ignoring other performances.

However, when using a process capable of bringing out a comprehensively high performance including other performances, the possibility for realization is not high. For example, in the case of a CMOS process having a minimum width of 0.35 to 1$\mu$, a typical value of $\gamma$ ranges between 0.2 and 0.4. In the case of this value, it is difficult for the circuit shown in FIG. 1 to achieve the rail-to-rail operation at a low voltage.

Moreover, a restriction condition is present for the voltage Vbs to be applied between a well and a source. In the case of a P-type MOS transistor, the well is the N type and the source is the P type. That is, a P-N junction is formed between the well and the source. When a source voltage is higher than a well voltage by approx. 0.7 V or more, the P-N junction is turned on as a forward direction diode and current flows. Therefore, it is impossible to form a potential difference of 0.7 V or more.

Therefore, in the case of one-hand restriction of the control range of a threshold voltage, Vbs of −0.7 V is the lower limit value in the expression (4). However, when increasing a threshold value to the negative side, the threshold voltage can be controlled in the tolerance of a power supply voltage because the P-N junction is the opposite direction.

Then, when the above condition is applied, it is described how a source voltage changes to gate voltages of the MOS transistors M2 and M3 of the differential input portion 10 in FIG. 1.

As an example, it is assumed that the power supply voltage Vdd is equal to 1V, Vthp is equal to −0.3 V, $\Delta$ is equal to 0.2 V, Vref is equal to 0.9 V, and $\gamma$ is equal to 0.3. For comparison, description is made while referring to the conventional operational amplifier in FIG. 9.

Figure 9:
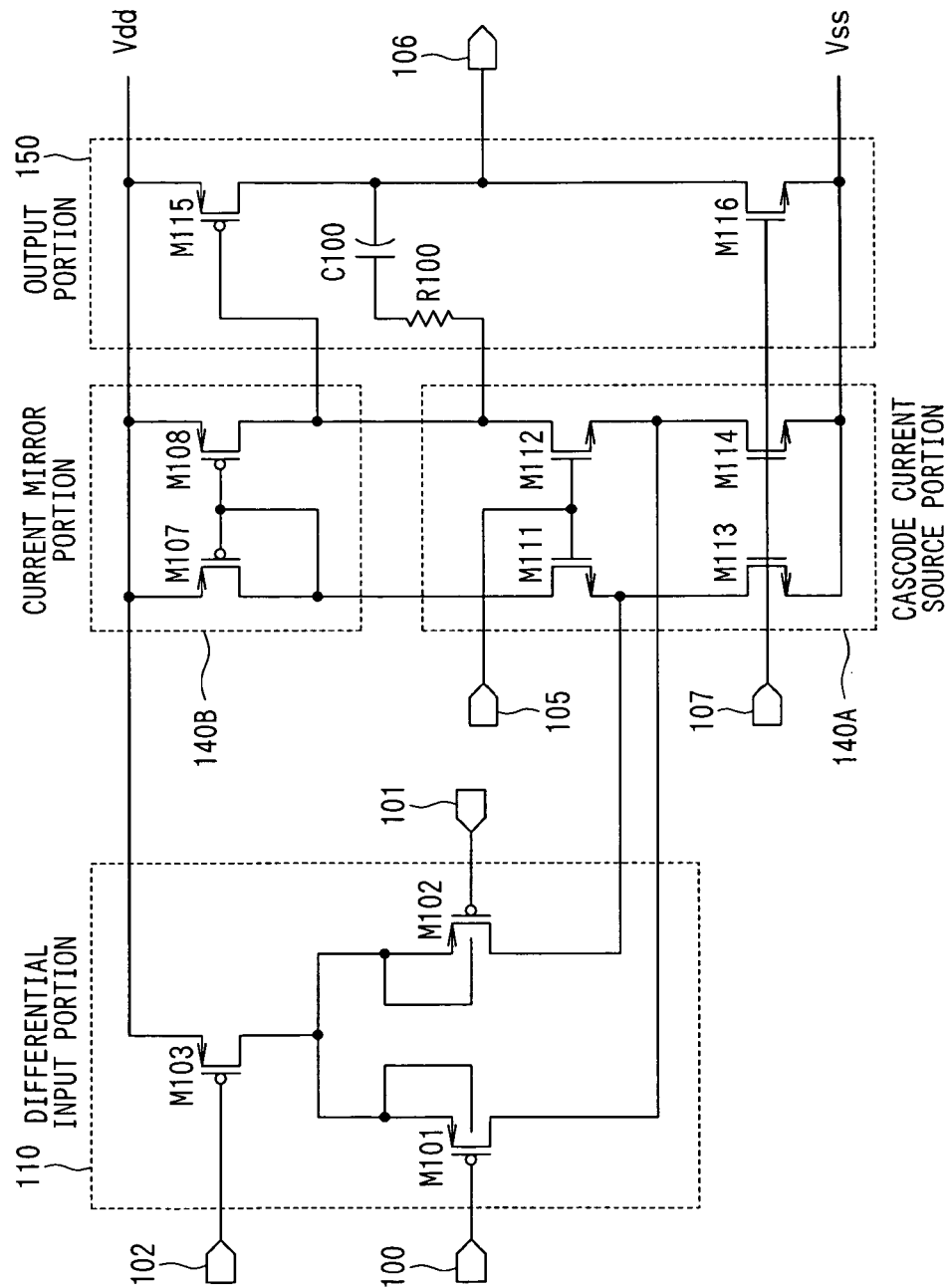
FIG. 9 is a circuit diagram showing another circuit of a conventional operational amplifier.

First, the difference between configurations of the second embodiment shown in FIG. 1 and the conventional operational amplifier shown in FIG. 9 is described.

The second embodiment is different from the conventional operational amplifier in configuration in that the differential amplifier 50 is added, the differential amplifier 50 compares source voltages of the MOS transistors M2 and M3 with the reference voltage Vref, generates an output voltage in accordance with the comparison result, and supplies the generated output voltage to a well terminal as the well voltage of the MOS transistors M2 and M3. In other words, the applied voltage Vbs between wells and sources of the MOS transistors M2 and M3 is controlled so that Vbs is not equal to zero.

Figure 4:
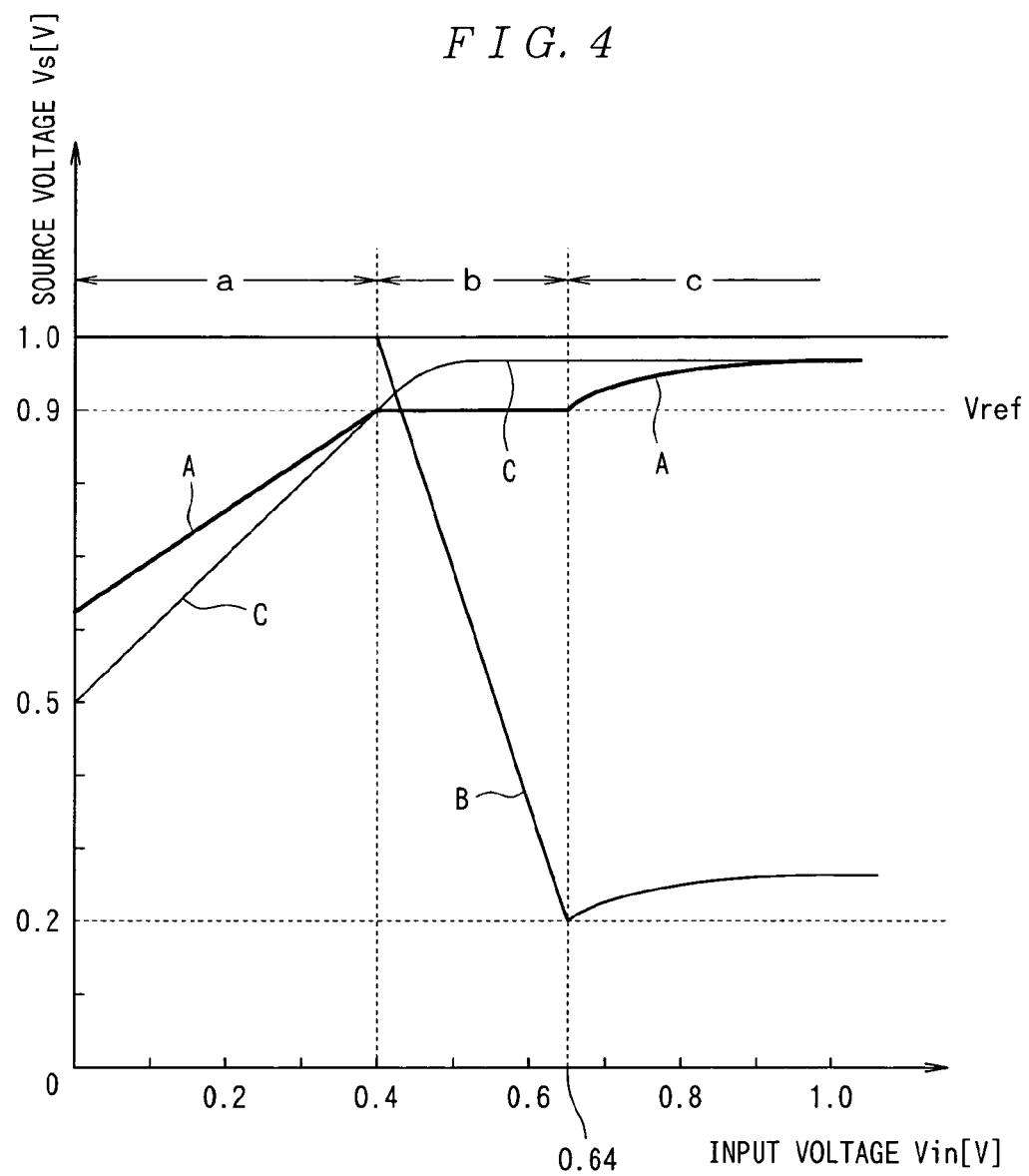
FIG. 4 is an illustration for explaining a relation input voltages and source voltages of MOS transistors M2 and M3 under a predetermined condition of the second embodiment.

The behavior of voltages of gate terminals and source terminals of the MOS transistors M101 and M102 of the differential input portion 110 of the conventional operational amplifier in FIG. 9 is shown by a thin continuous line C in FIG. 4. In FIG. 4, the axis of abscissa shows input voltage and the axis of ordinate shows source voltage.

A relation between source voltage Vs and gate voltage, that is, input voltage Vin in the expression (3) is shown by the following expression (7).

$$Vs = Vin + 0.5 \qquad (7)$$

Therefore, the region of "a" follows the expression (7). However, when an output approaches 1 V which is a power supply voltage, the voltage between source and drain of the MOS transistor M103 for a current source lowers and the supply quantity of current decreases. Therefore, in regions "b" and "c", the output is saturated at a portion close to 1 V as shown in FIG. 4.

Then, the characteristic when controlling a well voltage like the case of the second embodiment in FIG. 1 is shown by the thick continuous line A in FIG. 4. The axis of ordinate denotes source voltage. Moreover, in this case, well voltage is shown by the continuous line B.

In this case, the source voltage is lower than 0.9 V which is the value of Vref in the region "a". Moreover, in this case, the threshold value is increased in the negative direction to make the output approach 0.9 V. However, because the well voltage cannot exceed 1 V which is a power supply voltage, it is fixed to 1 V and the threshold voltage becomes a value slightly larger in the negative direction than the case of Vbs=0. When the input voltage Vin rises, Vbs is decreased and as a result, Vth slightly changes in the positive side. Therefore, the tilt is moderately changed compared to the case in which the well voltage is not controlled (thin continuous line C).

Then, when entering the region "b", the well voltage starts lowering from 1 V. Then, control is performed so that output becomes 0.9 V until the well voltage becomes 0.7 V to the source voltage. The output works so that it becomes 0.9 V in a range of 0.1 V to −0.7 V as the voltage Vbs between the well terminal and the source terminal. Because $\gamma$ is 0.3 in the region "b", it can be said that the interval of approx. 0.24 V is an output-constant range.

Moreover, when Vbs reaches 0.7 V, the diode is turned on to become a constant value. Therefore, even if the input voltage (gate voltage) becomes higher than the constant value, the output starts rising again to approach the power supply voltage as shown in the region "c" because threshold value control is not performed.

Thus, operation ranges of the MOS transistors M2 and M3 of the differential input portion 10 are widened by the interval corresponding to the region "b" compared to the case in which control of the well voltage is not performed. In the interval of "b", M1 serving as a current-source MOSFET normally operates. It is assumed that the MOSFET does not normally operate when the drain voltage of M1 exceeds 0.9 V.

As shown in FIG. 4, the range in which the operational amplifier of the second embodiment in FIG. 1 normally operates is 0 to 0.64 V. However, the range in which the conventional operational amplifier in FIG. 9 normally operates is 0 to 0.4 V.

Therefore, by using the circuit of the second embodiment in FIG. 1, the input operation range is widened by 0.24 V. Thus, when the constant γ is small, it is possible to widen the input operation range in the case of the second embodiment in FIG. 1 but it is impossible to perform the rail-to-rail operation.

Third Embodiment

Then, an operational amplifier of third embodiment of the present invention is described below by referring to FIG. 5. The third embodiment is an operational amplifier capable of performing the rail-to-rail operation even if the constant γ is greatly smaller than 3.

Figure 5:
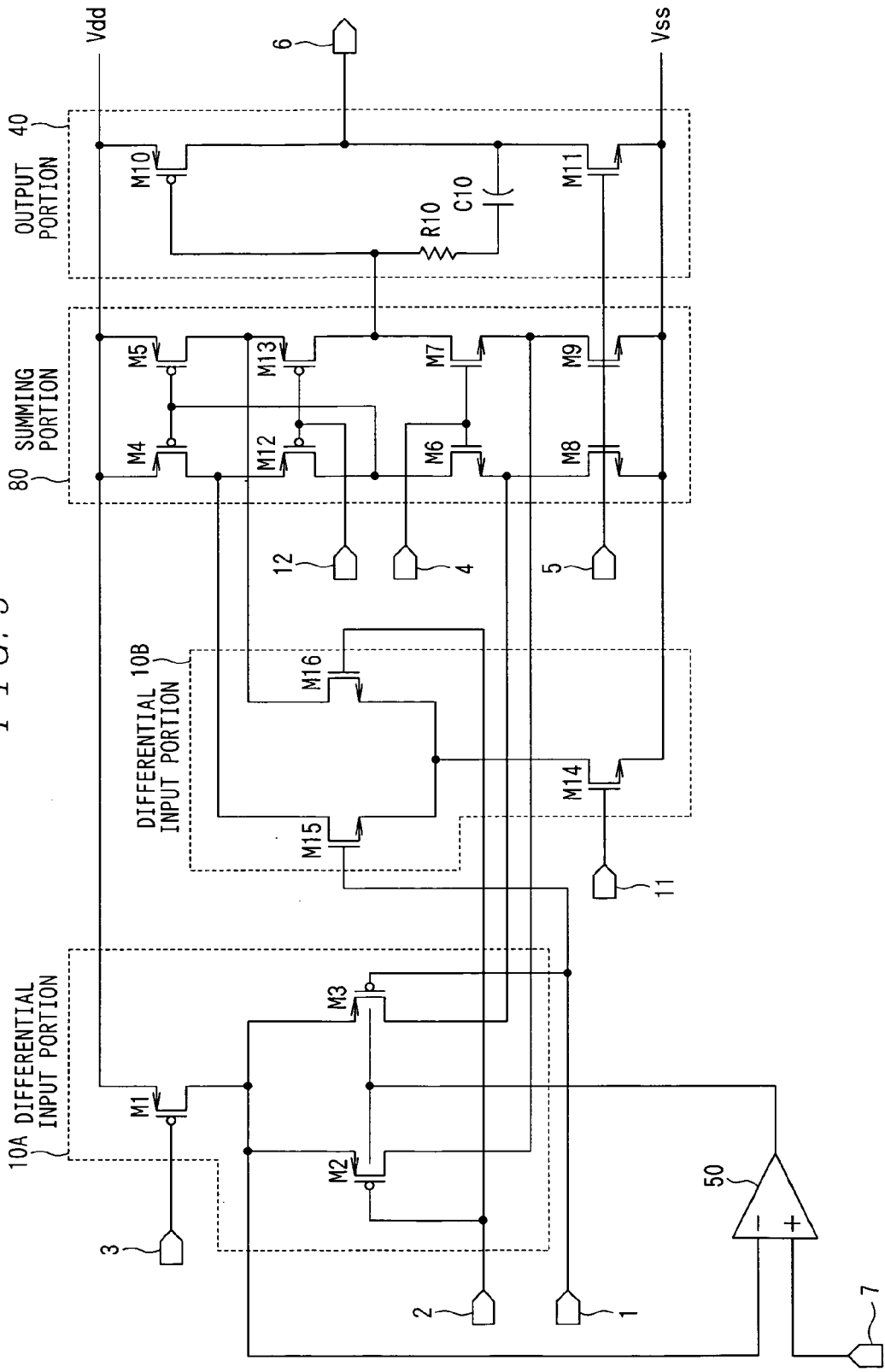
FIG. 5 is a circuit diagram showing a configuration of third embodiment of an operational amplifier of the present invention.

The third embodiment is a folded cascode operational amplifier which is provided with a differential input portion 10A, differential input portion 10B, summing portion 80, output portion 40, and differential amplifier 50 serving as a well voltage control portion as shown in FIG. 5.

That is, the third embodiment is constituted by combining a first folded cascode differential amplifying portion using a p-type MOS transistor as an input transistor and constituted of the differential input portion 10A and summing portion 80 with a second folded cascode operational amplifier portion using an N-type MOS transistor as an input transistor and constituted of the differential input portion 10B and summing portion 80.

In other words, the third embodiment is constituted by adding the differential input portion 10B using an N-type MOS transistor as an input transistor to the second embodiment shown in FIG. 1 and replacing the cascode current source portion 20 and current mirror portion 30 of the second embodiment with the summing portion 80 in accordance with the summing of the differential input portion 10B.

Therefore, the differential input portion 10A, output portion 40, and differential amplifier 50 of the third embodiment are the same as the differential input portion 10, output portion 40, and differential amplifier 50 of the second embodiment shown in FIG. 1 in configuration. Therefore, the same component is provided with the same symbol and its detailed description is omitted according to necessity.

The differential input portion 10A is provided with P-type MOS transistors M2 and M3 of a differential pair for inputting a differential signal and P-type MOS transistor M1 functioning as a current source for supplying a constant current to the MOS transistors M2 and M3 of the differential pair. The MOS transistors M2 and M3 are respectively provided with a well terminal. When an output voltage is supplied to the well terminals from the differential amplifier 50, well voltages of the MOS transistors M2 and M3 are controlled. Specific structures of the MOS transistors M2 and M3 are the same as those of the MOS transistors M2 and M3 of the differential input portion 10 shown in FIG. 1.

The differential input portion 10B is provided with N-type MOS transistors M15 and M16 of a differential pair for inputting a differential signal and N-type MOS transistor M14 functioning as a current source for supplying a constant current to the MOS transistors M15 and M16 of the differential pair.

The summing portion 80 is a circuit for summing the current of the differential input portion 10A and the current of the differential input portion 10B.

Therefore, the summing portion 80 is provided with an N-type MOS transistor M6 constituting a folded cascode circuit with the MOS transistor M3, N-type MOS transistor M7 constituting a folded cascode circuit with the MOS transistor M2, N-type MOS transistor M8 functioning as a first current source for supplying a constant current to the MOS transistors M3 and M6, and N-type MOS transistor M9 functioning as a second current source for supplying a constant current to the MOS transistors M2 and M7.

Moreover, the summing portion 80 is provided with a P-type MOS transistor M12 constituting a folded cascode circuit with the MOS transistor M15, P-type MOS transistor M13 constituting a folded cascode circuit with the MOS transistor M16, MOS transistor M4 functioning as a third current source for supplying a constant current to the MOS transistor M12 and M15, and MOS transistor M5 functioning as a fourth current source for supplying a constant current to the MOS transistors M16 and M13.

In the case of the output portion 40, a signal output from the summing portion 80 is amplified by the P-type MOS transistor M10 using the N-type MOS transistor M11 as an active load and output. Moreover, as shown in FIG. 5, the output portion 40 includes a resistance R10 and capacitor C10 for performing phase compensation.

The differential amplifier 50 compares the voltage of the common connection portion between the MOS transistors M2, M3, and M1 with a predetermined reference voltage Vref, generate an output voltage in accordance with the comparison result, and supplies the generated output voltage to well terminals of the MOS transistors M2 and M3 as the well voltage of the MOS transistors M2 and M3.

Then, detailed configurations of the differential input portion 10B and summing portion 80 are described below by referring to FIG. 5.

First, details of the differential input portion 10B are described below. The gate of one-hand MOS transistor M15 constituting a differential pair is connected to an inversion input terminal 1 so that an inversion input signal is supplied to the gate. Moreover, the gate of the other-hand MOS transistor M16 constituting the differential pair is connected to a non-inversion input terminal 2 so that a non-inversion input signal is input to the gate.

Sources of the MOS transistors M15 and M16 are connected in common and the common connection portion of the sources is connected to the drain of the MOS transistor M14. The drain of the MOS transistor M15 is connected with the source of the MOS transistor M12. The drain of the MOS transistor M16 is connected with the source of the MOS transistor M13.

The gate of the MOS transistor M14 is connected to a bias terminal 11 so that a predetermined bias voltage is applied to the gate. Moreover, a power supply voltage Vss is supplied to the source of the MOS transistor M14.

Then, a configuration of the summing portion 80 is described below. Gates of the MOS transistors M12 and M13 are connected to a bias terminal 12 so that a predetermined bias voltage is applied to the gates. Moreover, each of drains of the MOS transistors M12 and M13 is connected to each corresponding drain of the MOS transistors M6 and M7. Furthermore, each of sources of the MOS transistors M12 and M13 is connected to each corresponding drain of the MOS transistors M4 and M5.

The MOS transistors M4 and M5 constitute a current mirror. That is, gates of the MOS transistors M4 and M5 are connected in common and the common connection portion between the MOS transistors M4 and M5 is connected to the common connection portion between the MOS transistors M6 and M12. Moreover, sources of the MOS transistors M4 and M5 are connected in common so that a power supply voltage Vdd is supplied to the common connection portion between the MOS transistors M4 and M5.

Because detailed configuration of other portion of the summing portion 80 are the same as the configuration of the cascode current source portion 20 of the second embodiment in FIG. 1, its description is omitted.

Then, the effective range of operations of the third embodiment constituted of this configuration is described below.

Input operation ranges of the MOS transistors M2 and M3 of the differential input portion 10A of the third embodiment are the same as input operation ranges of MOS transistors M2 and M3 of the differential input portion 10 of the second embodiment.

Then, the input operation ranges are described below by using specific values. In FIG. 5, a voltage range to inputs of the MOS transistors M2 and M3 of the differential input portion 10A is considered by using a case of Vdd=1V, Vthp=−0.3V, Δ=0.2V, and γ=0.3 which are parameters used for description of FIG. 4 as an example.

When the MOS transistors M2 and M3 for input are only the P type only in the differential input portion 10 like the case of the second embodiment in FIG. 1, an input voltage range is 0 to 0.64 V as described for FIG. 4.

Moreover, as described above, in the case of the conventional operational amplifier shown in FIG. 9, an input voltage range is 0 to 0.4 V.

Then, input operation ranges of the MOS transistors M15 and M16 of the differential input portion 10B of the third embodiment are described below.

The MOS transistors M15 and M16 are the N type and the current-voltage characteristic of the MOS transistors M15 and M16 can be shown by the following expression (8) similarly to the case described for the expression (1).

$$Ids=(W/L)\cdot\mu\cdot Cox(Vin-Vs-Vthn)^2 \quad (8)$$

In this case, w denotes the channel width of the MOS transistors M15 and M16, L denotes the channel length of the MOS transistors M15 and M16, μ denotes mobility, Cox denotes a capacity for unit area, and Vs denotes the source voltage of the MOS transistors M15 and M16. Vthn denotes the threshold voltage of the MOS transistors M15 and M16.

In this case, the current value Ids becomes a constant value because a constant current is supplied by the MOS transistor M14 for a current source.

From the expression (8), each source voltage Vs of the MOS transistors M15 and M16 is obtained from the following expression (9).

$$Vs=Vin-Vthn-\Delta \quad (9)$$

In this case, $\Delta=\sqrt{\{Ids/(W/L)\cdot\mu\cdot Cox\}}$

From the expression (9), it is found that the source voltage Vs becomes a value obtained by subtracting the threshold voltage Vthn and Δ from the input voltage Vin.

For the MOS transistor M14 for a current source to normally operate, the source voltage Vs requires at least 0.05 to 0.2 V. When assuming Vthn as 0.3 V, Δ as 0.2 V, and Vs as 0.1 V, the MOS transistor M14 normally operates when the input voltage Vin is 0.6 V or higher. That is, the range of the input voltage Vin at which the MOS transistors M15 and M16 normally operate is 0.6 to 1 V when the power supply voltage Vdd is equal to 1 V.

Moreover, as described above, the MOS transistors M2 and M3 of the differential input portion 10A normally operate when the input voltage Vin ranges between 0 and 0.64 V.

Thus, in the case of the third embodiment shown in FIG. 5, when the power supply voltage Vdd is 1 V, either or both of the N-type MOS transistors M15 and M16 of the differential input portion 10B or P-type MOS transistors M2 and M3 of the differential input portion 10A always operates in the range which the input voltage Vin is 0 to 1 V. Therefore, it is possible to realize an operational amplifier for performing the rail-to-rail operation.

In this case, because the interval in which N-type MOS transistor and P-type MOS transistor operate at the same time is 0.04 V, they normally operate in all input voltage ranges even if lowering a power supply voltage up to 0.96 V by further lowering the voltage by 0.04 V.

Figure 8:
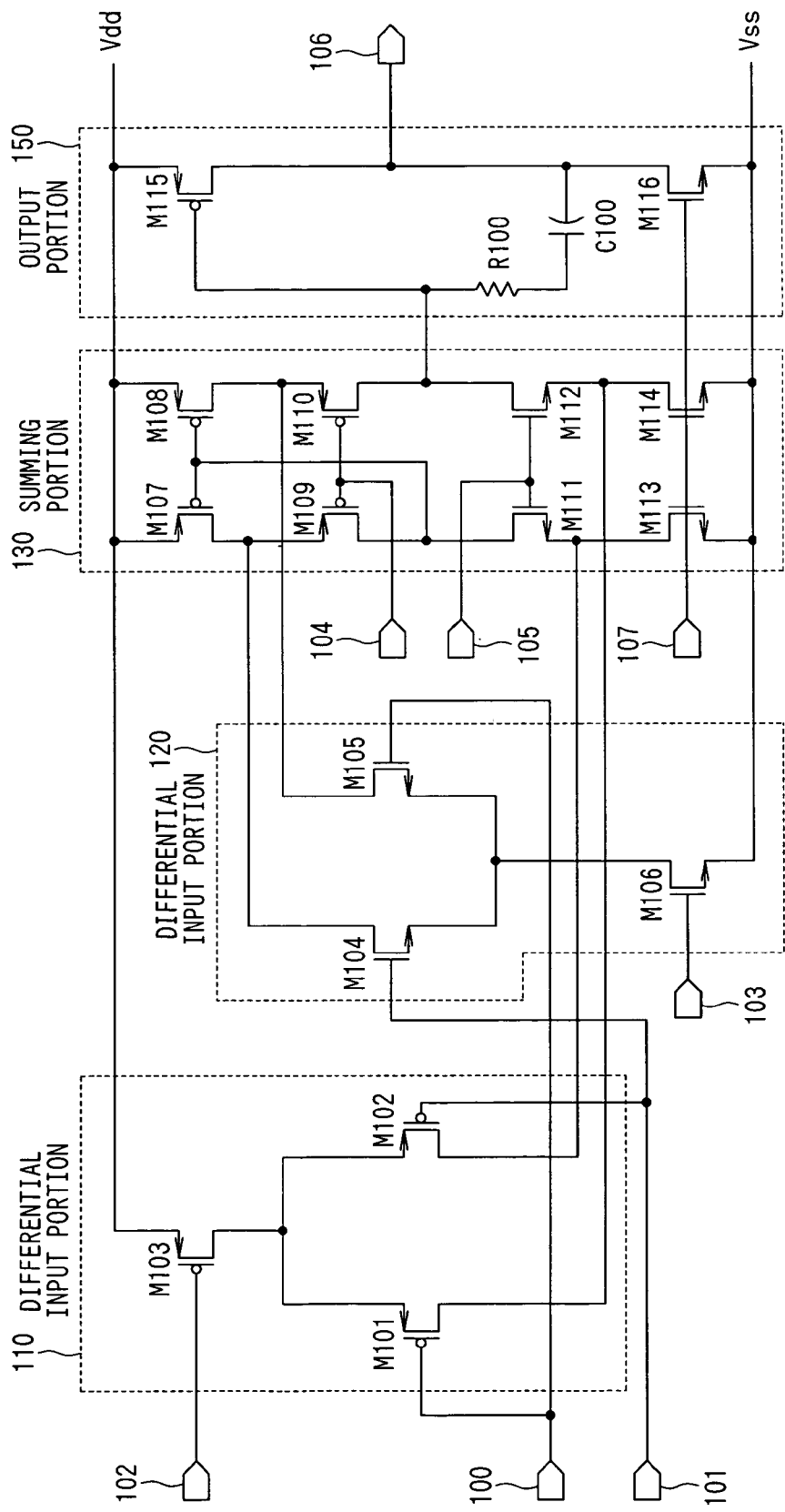
FIG. 8 is a circuit diagram showing a circuit of a conventional operational amplifier.

However, when the power supply voltage Vdd is 1 V and the conventional operational amplifier shown in FIG. 8 is used, the input voltage range in which an N-type MOS transistor can operate is 0.6 to 1 V and the operational range of a P-type MOS transistor is 0 to 0.4 V as described above. Therefore, the amplifier does not normally operate in the interval (range) of 0.4 to 0.6 V. Therefore, for the amplifier to operate at all input voltages, it is necessary to set the power supply voltage to 1.2 V.

In the case of the above calculation, only values of the threshold voltage and Δ are used. In fact, however, a complex calculation is necessary. However, the above calculation is sufficient to explain a difference between effects of an operational amplifier of the present invention and a conventional operational amplifier.

That is, the operational amplifier of the third embodiment shown in FIG. 5 uses a process which has been used so far. Therefore, even if a substrate coefficient is small and the power supply voltage is lowered than ever, the rail-to-rail operation can be performed.

Fourth Embodiment

Then, an operational amplifier of fourth embodiment of the present invention is described below by referring to FIG. 6.

The fourth embodiment is an operational amplifier for performing the rail-to-rail operation even for a power supply voltage lower than that of the third embodiment shown in FIG. 5. As shown in FIG. 6, the operational amplifier is provided with a differential input portion 10A, differential input portion 10C, summing portion 80, output portion 40, differential amplifier 50 serving as a first well voltage control portion, and differential amplifier 60 serving as a second well voltage control portion.

Figure 6:
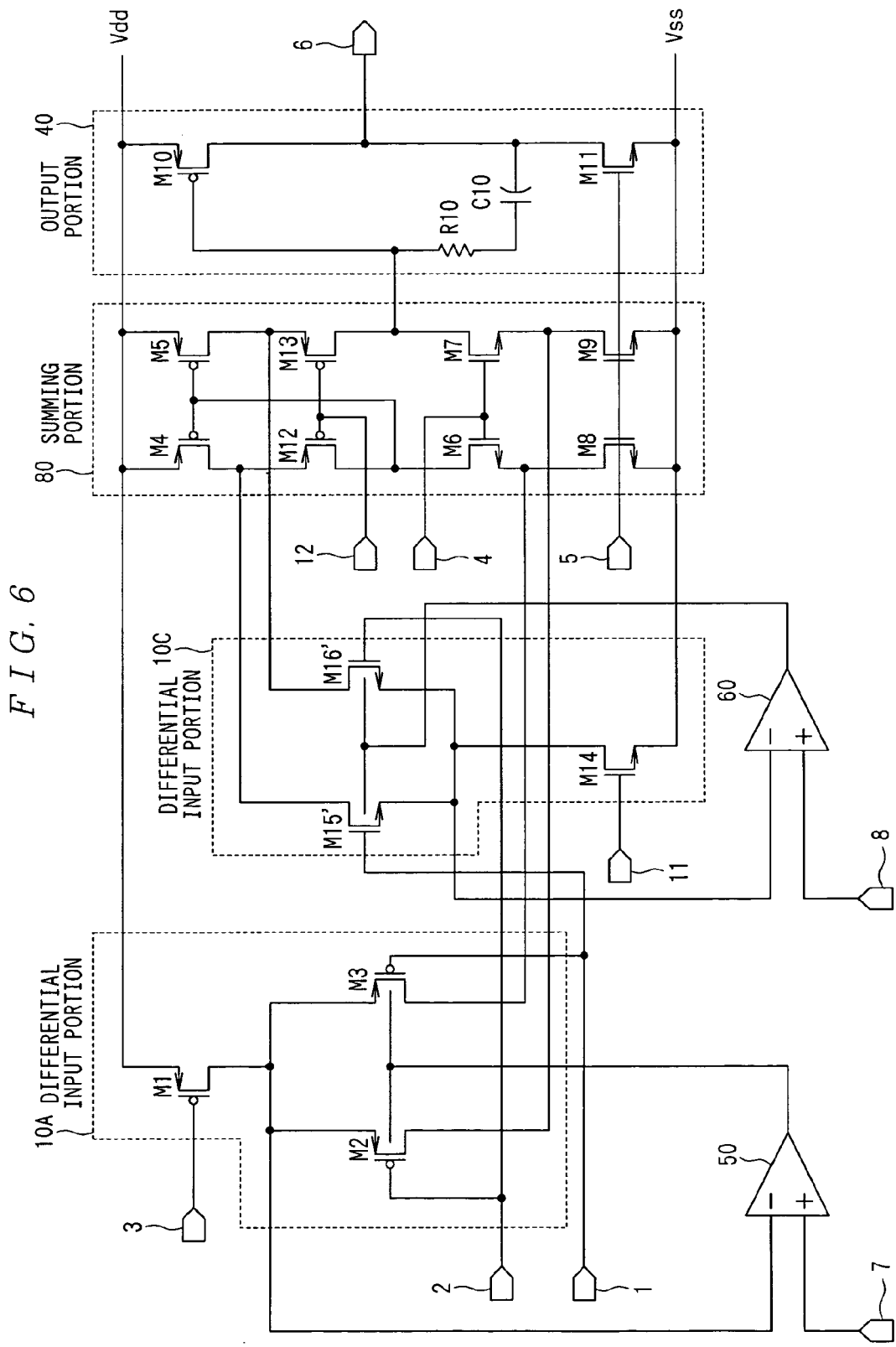
FIG. 6 is a circuit diagram showing a configuration of fourth embodiment of an operational amplifier of the present invention.

That is, the fourth embodiment is constituted by replacing the differential input portion 10B of the third embodiment shown in FIG. 5 with the differential input portion 10C shown in FIG. 6 and thereby adding a differential amplifier 60 as shown in FIG. 6.

Therefore, the differential input portion 10A, summing portion 80, output portion 40, and differential amplifier 50 of the fourth embodiment are the same as the differential input portion 10A, summing portion 80, output portion 40, and differential amplifier 50 of the third embodiment shown in FIG. 5 in configuration. Therefore, the same component is provided with the same symbol and detailed description of the configuration is omitted according to necessity.

The differential input portion 10A is provided with P-type MOS transistors M2 and M3 of a differential pair for inputting a differential signal, P-type MOS transistor M1 functioning as a current source for supplying a constant current to the MOS transistors M2 and M3 of the differential pair. The MOS transistors M2 and M3 are respectively provided with a well terminal so that well voltages of the MOS transistors M2 and M3 are controlled because an output voltage is supplied to the well terminals from the differential amplifier 50.

The differential input portion 10C is provided with N-type MOS transistors M15' and M16' of a differential pair for, inputting a differential signal and an N-type MOS transistor M14 functioning as a current source for supplying a constant current to the MOS transistors M15' and M16' of the differential pair. The MOS transistors M15' and M16' are respectively provided with a well terminal. When an output voltage is supplied to the well terminals from the differential amplifier 60, well voltages of the MOS transistors M15' M16' are controlled.

Figure 7:
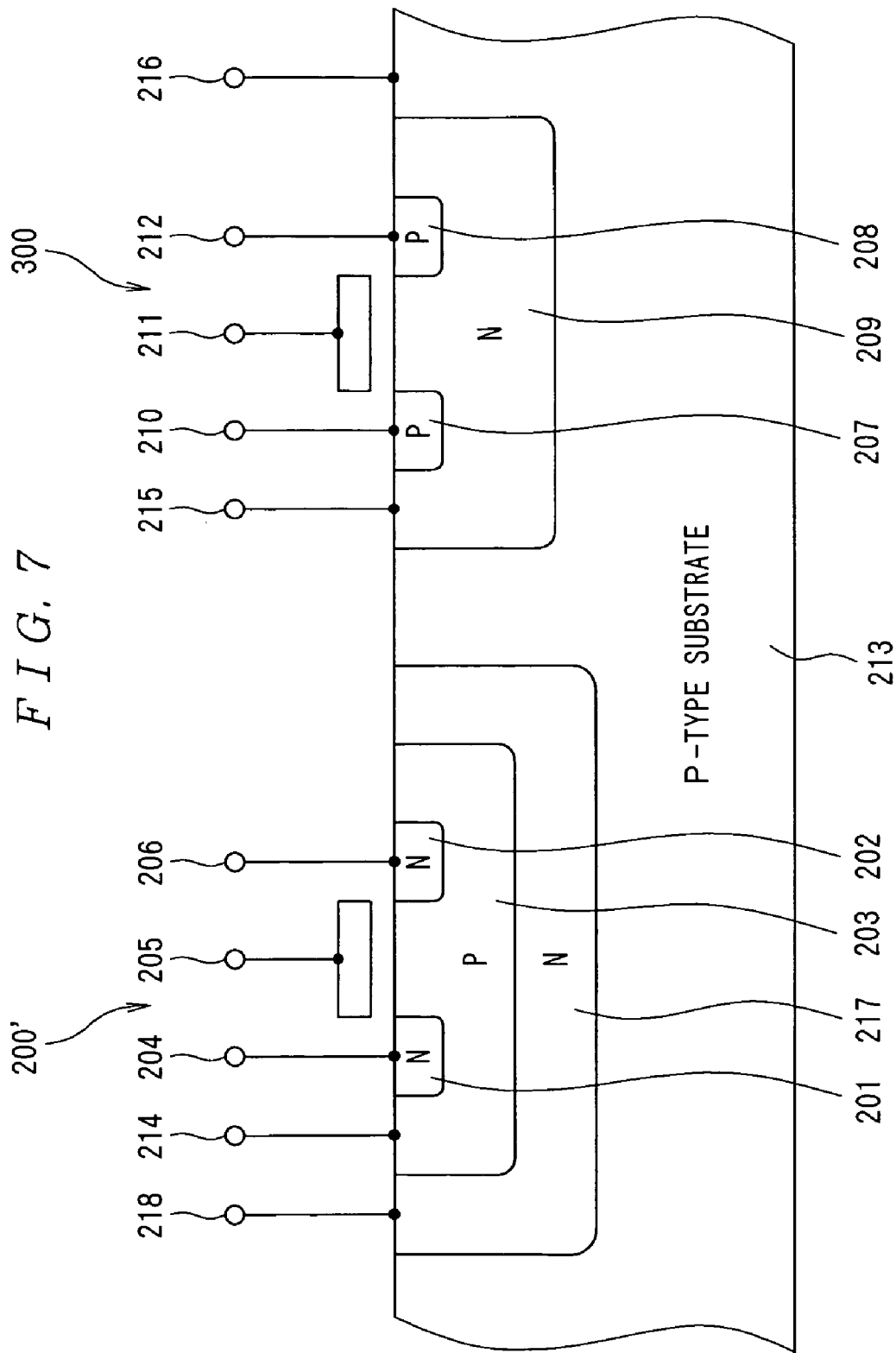
FIG. 7 is a sectional view for explaining a specific structure of a MOS transistor of the differential input portion shown in FIG. 6.

In this case, specific structures of the P-type MOS transistors M2 and M3 of the differential input portion 10A and N-type MOS transistors M15' and M16' of the differential input portion 10C are shown in FIG. 7 and this point will be described later.

The summing portion 80 is a circuit for summing the current of the differential input portion 10A and that of the differential input portion 10C.

Therefore, the summing portion 80 is provided with an N-type MOS transistor M6 constituting a folded cascode circuit with the MOS transistor M3, N-type MOS transistor M7 constituting a folded cascode circuit with the MOS transistor M2, N-type MOS transistor M8 functioning as a first current source for supplying a constant current to the MOS transistors M3 and M6, and N-type MOS transistor M9 functioning as a second current source for supplying a constant current to the MOS transistors M2 and M7.

Moreover, the summing portion 80 is provided with a P-type MOS transistor M12 constituting a folded cascode circuit with the MOS transistor M15', P-type MOS transistor M13 constituting a folded cascode circuit with the MOS transistor M16', MOS transistor M4 functioning as a third current source for supplying a constant current to the MOS transistors M15' and M12, and MOS transistor M5 functioning as a fourth current source for supplying a constant current to the MOS transistors M16' and M13.

In the case of the output portion 40, a signal output from the summing portion 80 is amplified by a P-type MOS transistor M10 using an N-type MOS transistor M11 as an active load and output. Moreover, as shown in FIG. 6, the output portion 40 includes a resistance R10 and capacitor C10 for performing phase compensation.

The differential amplifier 50 compares the source voltage of each of the MOS transistors M2 and M3 with a predetermined reference voltage Vref, generate an output voltage in accordance with the comparison result, and supplies the generated output voltage to well terminals of the MOS transistors M2 and M3 as well voltages of the MOS transistors M2 and M3.

The differential amplifier 60 compares the source voltage of each of the MOS transistors M15' and M16' with a predetermined reference voltage Vref', generates an output voltage in accordance with the comparison result, and supplies the generated output voltage to well terminals of the MOS transistors M15' and M16' as well voltages of the MOS transistor M15' and M16'. A specific configuration of the differential amplifier 60 is the same as that of the differential amplifier 50 shown in FIG. 3.

Then, a detailed configuration of the differential input portion 10C is described below by referring to FIG. 6.

As shown in FIG. 6, the gate of one-hand MOS transistor M15' constituting a differential pair is connected to an inversion input terminal 1 so that an inversion input signal is input to the gate. The gate of the other-hand MOS transistor M16' constituting a differential pair is connected to a non-inversion input terminal 2 so that a non-inversion input signal is input to the gate.

Sources of the MOS transistors M15' and M16' are connected in common and the common connection portion between the sources is connected to the drain of the MOS transistor M14. The drain of the MOS transistor M15' is connected to the source of the MOS transistor M12. The drain of the MOS transistor M16' is connected to the source of the MOS transistor M13. Well terminals of the MOS transistors M15' and M16' are connected in common.

Source voltages of the MOS transistors M15' and M16' are supplied to the negative input terminal of the differential amplifier 60. Moreover, the positive input terminal of the differential amplifier 60 is connected with a reference voltage input terminal 8 so that the predetermined reference voltage Vref' is supplied to the positive input terminal. Moreover, the output voltage of the differential amplifier 60 is supplied to well terminals of the MOS transistors M15' and M16' and well voltages of the MOS transistors M15' and M16' are controlled by the output voltage.

The gate of the MOS transistor M14 is connected to a bias terminal 11 so that a predetermined bias voltage is applied to the gate. Moreover, a power supply voltage Vss is supplied to the source of the MOS transistor M14.

Then, structures of the P-type MOS transistors M2 and M3 of the differential input portion 10A and N-type MOS transistors M15' and M16' of the differential input portion 10C are described below.

Because these MOS transistors can be respectively realized by a CMOS circuit fabricated in accordance with a CMOS process having a deep N well, their structures are described by referring to FIG. 7. In this case, these structures are respectively also referred to as a triple well structure.

As shown in FIG. 7, the CMOS circuit is constituted of an N-type MOS transistor 200' and P-type MOS transistor 300 formed on a P-type substrate 213 but the structure of the MOS transistor 200' is different from that of the CMOS circuit shown in FIG. 2.

That is, in the case of the MOS transistor 200', a deep N well 217 is inserted between a P well 203 and a P-type substrate 213 and a well terminal 218 for supplying a voltage to the deep N well 217 is connected.

In general, upper-side (high potential side) voltage Vdd is supplied to the well terminal 218. Thus, by forming the deep N well 217, it is possible to supply an optional voltage in a range from the lower-side power supply voltage Vss to the upper-side power supply voltage Vdd as long as a diode in which the voltage of the P well 203 is formed between the source 201 or drain 202 and the P well 203 is not turned on.

Therefore, it is possible to use the N-type MOS transistor 200' constituted of the structure shown in FIG. 7 as N-type MOS transistors M15' and M16' used for the differential input portion 10C and P-type MOS transistor 300 as the P-type MOS transistors M2 and M3 used for the differential input portion 10A.

According to the fourth embodiment constituted of this configuration, the differential amplifier 60 compares source voltages of the MOS transistors M15' and M16' with the reference voltage Vref', generates an output voltage in accordance with the comparison result, and supplies the generated output voltage to well terminals of the MOS transistors M15' and M16' as well voltage of the MOS transistors M15' and M16'.

In this case, it is allowed to set the reference voltage Vref' to at least 0.05 to 0.2 V because it is only necessary to supply a voltage at which the MOS transistor M14 for a current source normally operates. Therefore, in the case of the fourth embodiment, a voltage range to inputs of the MOS transistors M15 and M16 of the differential input portion 10C can be greatly widened similarly to the case of the third embodiment shown in FIG. 5. As an example, when assuming Vthn as 0.3 V, Δ as 0.2 V, and γ as 0.3, it is possible to widen an operable range by approx. 0.24 V.

Therefore, in the case of the third embodiment in FIG. 5, the rail-to-rail operation can be performed at 0.96 V. However, in the case of the fourth embodiment in FIG. 6, the rail-to-rail operation can be performed at 0.72 V and an operational amplifier operates at a lower power supply voltage.

In the case of the third and fourth embodiments, because every input terminal is connected only to the gate terminal of a MOS transistor, input current is zero.

Fifth Embodiment

Then, an operational amplifier of fifth embodiment is described below by referring to FIG. 14.

Figure 14:
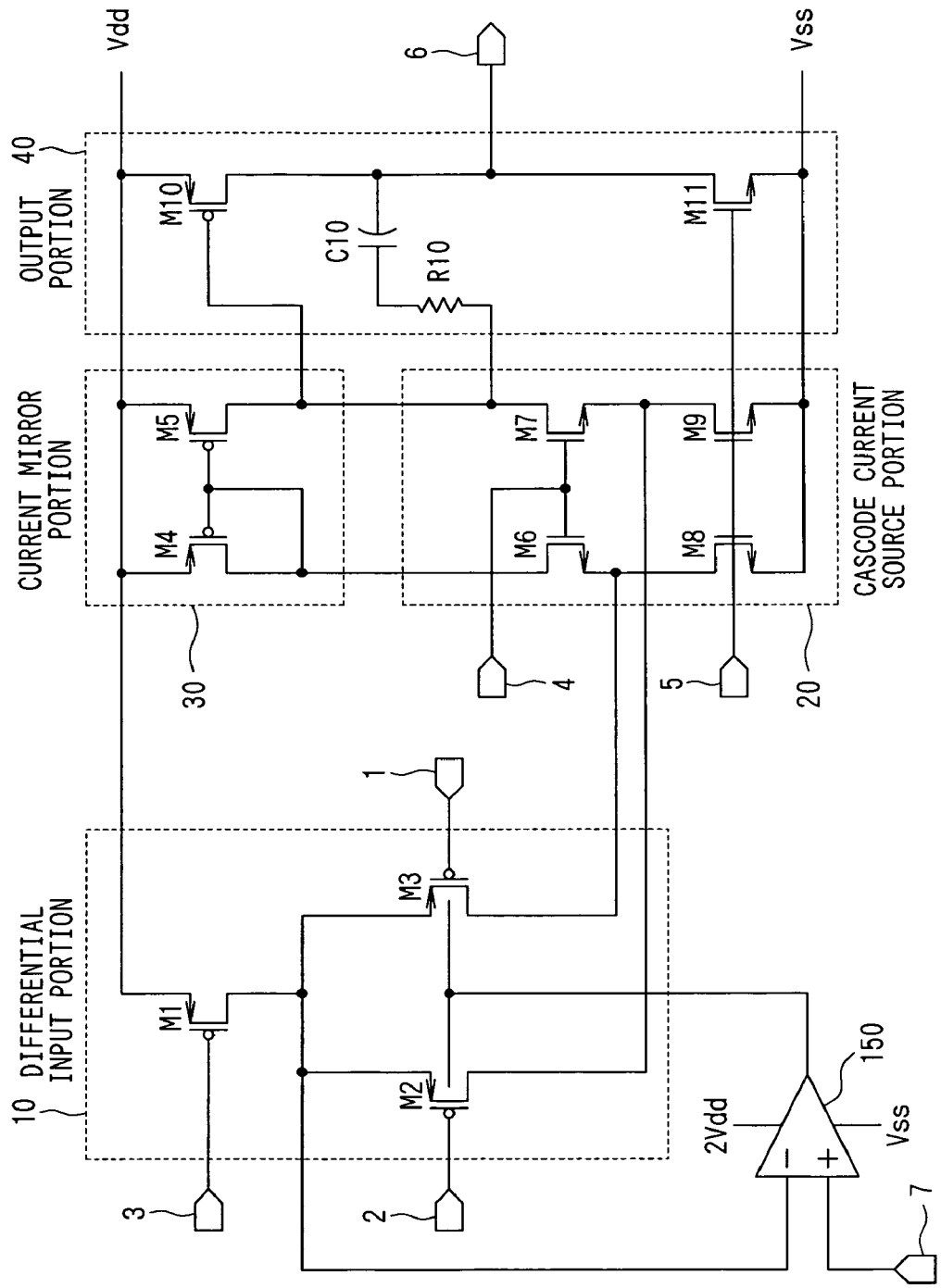
FIG. 14 is a circuit diagram showing a configuration of fifth embodiment of an operational amplifier of the present invention.

As a result of comparing the circuit of the fifth embodiment with that of the second embodiment in FIG. 1, the circuit of the fifth embodiment is a circuit obtained by replacing the differential amplifier 50 serving as a well voltage control portion in FIG. 1 with a differential amplifier 150 as shown in FIG. 14 but configurations other than that are the same as those in FIG. 1.

In the case of the second embodiment shown in FIG. 1, a power supply voltage for driving various portions is not described. That is, each of power supply, a positive power supply and a negative power supply are commonly connected in every circuit.

However, in the case of the fifth embodiment, as shown in FIG. 14, the positive power supply voltage supplied to the differential amplifier 150 is not Vdd used in common but it is set to 2 Vdd which is a voltage two times larger than the Vdd.

Hereafter, the fifth embodiment constituted of this configuration is described. However, descriptions of components common to those of the second embodiment are omitted.

Because the differential amplifier 150 serving as the well voltage control portion in FIG. 14 has a power supply voltage of 2 Vdd, an output voltage of the differential amplifier 150 also ranges between Vss and 2 Vdd. Because Vss is normally equal to 0, an output voltage range becomes two times by replacing the power supply voltage with Vdd to 2 Vdd.

Therefore, in the case of the fifth embodiment, it is possible to greatly widen a well voltage range capable of controlling the MOS transistors M2 and M3 and expect more expansion of the input voltage range compared to the case of the second embodiment.

Then, operations of the operational amplifier of the fifth embodiment are specifically described below by referring to FIG. 15.

Figure 15:
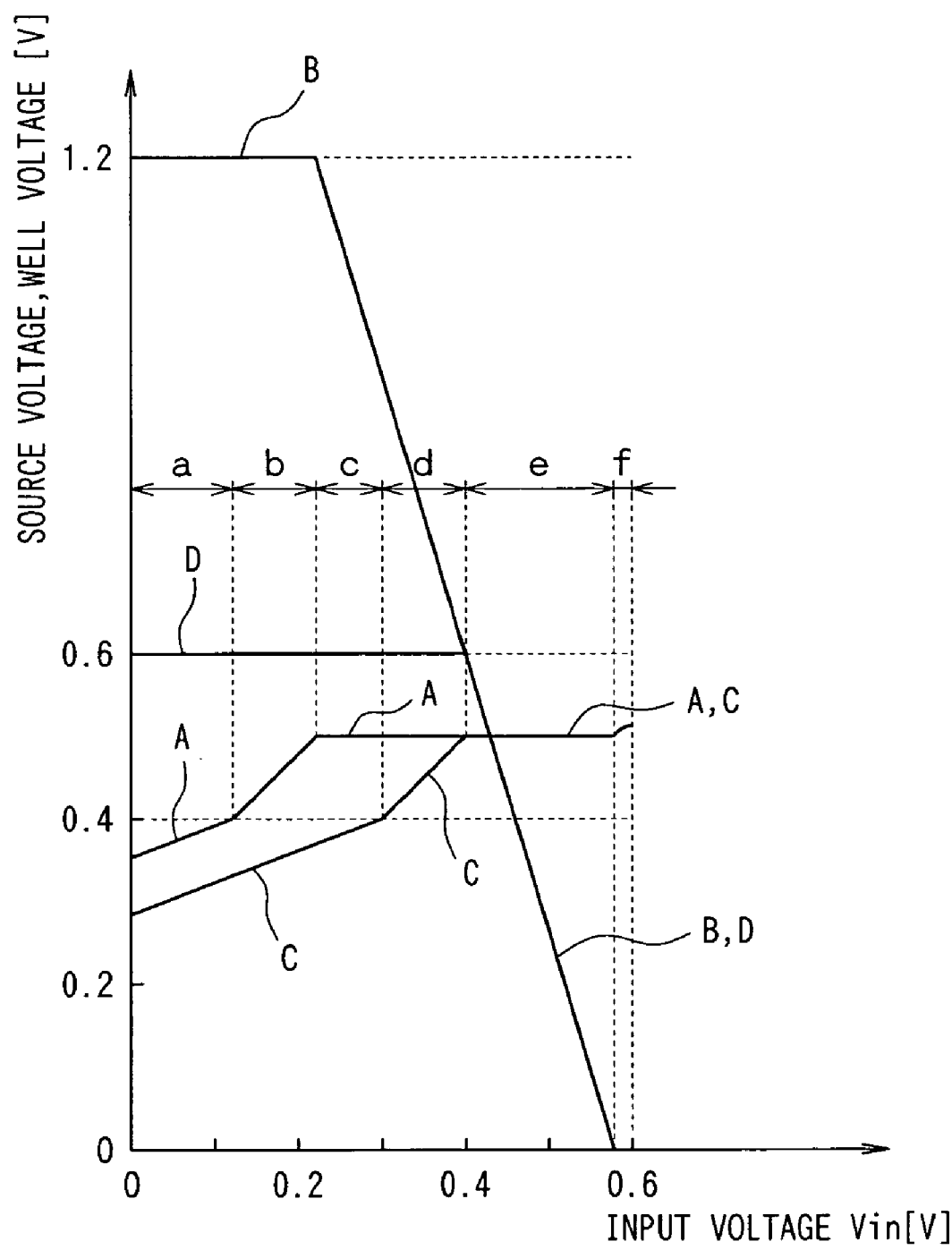
FIG. 15 is an illustration for explaining a relation between input voltages and source voltages of MOS transistors M2 and M3 under a predetermined condition of the fifth embodiment.

In the case of FIG. 15 as described for FIG. 4, the axis of abscissa shows the input voltage Vin and the axis of ordinate shows the voltage of the source terminal of each of the MOS transistors M2 and M3 and B shows the well voltage of each of the MOS transistors M2 and M3. Moreover, for comparison, it is assumed that the source voltage of each of M2 and M3 is C and the well voltage of each of M2 and M3 is D when the power supply voltage to be supplied to the differential amplifier 150 is Vdd. In other words, C and D correspond to graphs when using the operational amplifier shown in FIG. 1.

As a result of comparing FIG. 15 with FIG. 4, a region f corresponding to the region c shown in FIG. 4 is very narrow. This is because Δ is decreased and the region c is narrowed by decreasing the absolute value of the threshold value of a PMOS transistor, decreasing current, or increasing (W/L) in order to obtain an effect of further expanding an operation range in the case of the fifth embodiment. In this case, for description of Δ, refer to description of the above expression (3).

A threshold value can be easily changed by changing the impurity implanting quantity for threshold value adjustment in the fabrication process of a MOS transistor.

In this case, a case of power supply voltage Vdd=0.6 V, Vthp=0.3 V, Δ=0.2 V, and γ=0.3 is considered as an example.

First, a case is described in which the positive power supply voltage of the differential amplifier 150 is Vdd.

When the input voltage Vin is present in the region f, the well voltage reaches a negative power supply and the threshold value is not effectively controlled. In the case of the region e, the threshold value is effectively controlled, the source voltage becomes constant at 0.5 V, and the operational amplifier in FIG. 1 normally operates.

In the case of the region d, the well voltage is Vdd, that is, the positive power supply of the differential amplifier reaches 0.6 V but the threshold value is not controlled. However, all circuits in FIG. 14 normally operate and the operational amplifier normally operates.

In the regions a, b, and c, the tilt of C showing the behavior of the source voltage is moderate compare to the case of the region d but the operational amplifier does not normally operate. The regions a, b, and c are described in detail.

In the case of FIG. 14, the MOS transistors M2 and M3 are not normally operated when the source voltage of each of the MOS transistors M2 and M3 becomes 0.4 V or lower. This is because the input MOS transistors M2 and M3 and MOS transistors M8 and M9 working as current sources normally operate, a predetermined voltage present between a source and a drain is necessary and thereby, it is impossible to lower the source voltage Vs to a certain value or less.

In this case, because the sum of necessary voltages is 0.4, the voltage of the MOS transistors M2 and M3 or the MOS transistors M7 and M8 becomes a necessary between-source-and-drain voltage or lower at a portion where the source voltage is lower than 0.4 V and the operational amplifier does not normally operate. In this case, 0.4 V is a typical value but it fluctuates depending on the performance and design condition of a MOS transistor. In general, when considering threshold-voltage fabrication fluctuation or threshold value fluctuation due to temperature, it is impossible to expect that the value of 0.4 V which is set as normal operation is greatly lowered.

Then, a case is described in which the positive power supply voltage of the differential amplifier 150 is 2 Vdd.

When an input voltage is present in the region f, a threshold value is not effectively controlled because a well voltage reaches a negative power supply. In the regions c, d, and e, threshold values are effectively controlled, the source voltage becomes constant at 0.5 V, and the operational amplifier in FIG. 1 normally operates.

Because these regions are only e when the positive power supply voltage is Vdd, it is found that the region e becomes extremely wide by setting the positive power supply voltage to 2 Vdd. In the region b, the well voltage reaches 2 Vdd, that is, the positive power supply voltage 1.2 V of the differential amplifier but the threshold value is not controlled. However, because all circuits in FIG. 14 normally operate, the operational amplifier normally operates. This corresponds to the region d when the positive power supply voltage is Vdd.

In the region a, the tilt of A showing the behavior of a source voltage becomes moderate compared to the case of the region b but the operational amplifier does not normally operate. Thus, by changing the power supply voltage of the differential amplifier for controlling the well voltage from Vdd to 2 Vdd, it is possible to widen the range in which the operational amplifier normally operates by a value equivalent to the regions c and d.

Thus, in the case of the fifth embodiment, it is possible to widen an operation range by setting the power supply voltage used for the differential amplifier 150 for controlling a well voltage to a higher power supply voltage different from the positive power supply voltage Vdd used for the differential input portion 10, cascode current source portion 20, current mirror potion 30, and output portion 40 which are the body portion of the operational amplifier.

Moreover, as the power supply voltage rises, it is possible to more easily widen the operation range. However, the power supply voltage has an upper limit.

That is, a withstand voltage is limited for every process for forming a MOS transistor and it is necessary to use the MOS transistor in a range of not exceeding the upper limit.

Furthermore, when using the differential amplifier 150 in order to operate an operational amplifier at a low voltage, it is frequent not to prepare a separate high power supply voltage.

In this case, it is necessary to set a step-up circuit out of or in an IC chip. However, when raising the output voltage of a step-up circuit, problems occur that the circuit becomes complex and the power efficiency is deteriorated. Therefore, it is not always possible to blindly use a high voltage. However, it is possible to easily widen the operation range only by raising the voltage used for the differential amplifier 150.

In this case, in the case of the MOS transistor of the differential input portion 10 is a PMOS, there is no problem when a voltage to be applied to a well is higher than a source voltage. However, when the voltage is too low, a parasitic diode between a source and a well is turned on and a threshold voltage cannot be controlled. Therefore, there is no effect even if lowering the negative-side power supply voltage. However, in the case of an NMOS, when a well voltage is higher than a source voltage, a parasitic diode is turned on. Therefore, the same effect can be obtained by replacing the negative-side power supply voltage of a well control portion for controlling the well voltage with a lower voltage.

That is, by setting the negative-side power supply voltage Vss of the differential amplifier 60 in FIG. 6 to a lower voltage, it is possible to further expand the NMOS-side operation range.

It is an effective technique to generate the positive-side power supply voltage higher than Vdd or negative-side power supply voltage lower than Vss by using a step-up circuit or step-down circuit. That is, it is possible to generate an optimum power supply voltage without depending on a component out of an LSI. However, by newly setting a step-up circuit, an extra circuit and extra power are necessary.

A well-voltage control amplifier does not become a great load from the view point of power because it hardly has necessary output current. However, by supplying a positive-side power supply voltage higher than Vdd only to the output portion of the well-voltage control amplifier and using Vdd serving as a positive-side power supply voltage for a circuit other than an output portion, the load of a step-up circuit is further decreased and an advantage that the load can be decreased in circuit and power is obtained.

Figure 16:
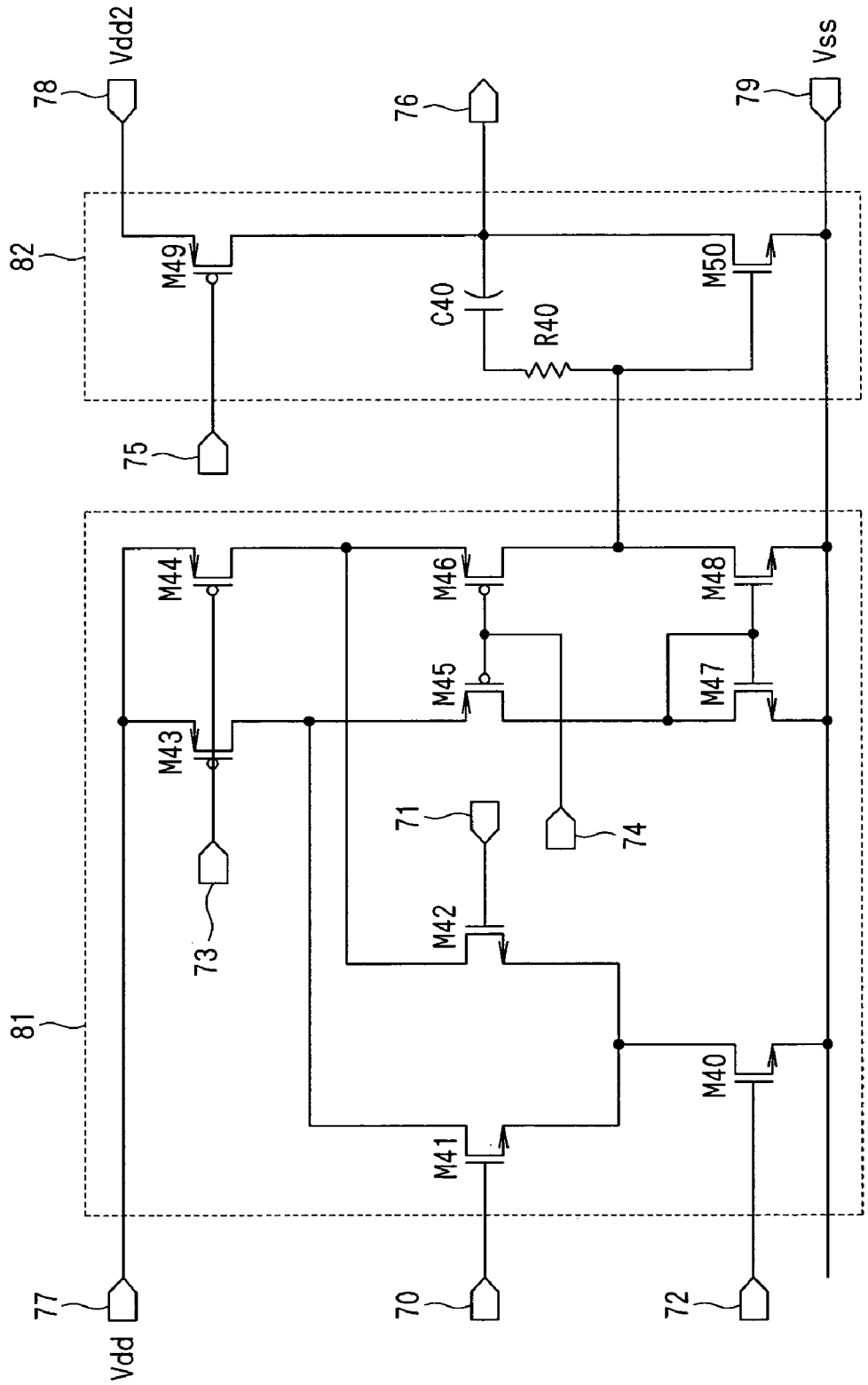
FIG. 16 is a circuit diagram showing another configuration of a well voltage control portion (differential amplifier) used for the fifth embodiment of an operational amplifier of the present invention.

FIG. 16 shows a differential amplifier for well voltage control when separating a power supply. As shown in FIG. 16, the differential amplifier is provided with a differential input portion 81 and output portion 82.

The differential input portion 81 is provided with N-type MOS transistors M41 and M42 constituted of a differential pair for inputting a differential signal, N-type MOS transistor M40 functioning as a current source, P-type MOS transistors M43 and M44, P-type MOS transistors M45 and M46 respectively functioning as a cascode transistor, and N-type MOS transistors M47 and M48 constituting as a current mirror circuit.

In the case of the output portion 82, a signal output from the differential input portion 81 is amplified by an N-type MOS transistor M50 using a P-type MOS transistor M49 as an active load and output. Moreover, as shown in FIG. 16, the output portion 82 includes a resistance R40 and capacitor C40 for performing phase compensation.

More minutely, the gate of one-hand MOS transistor M41 constituting a differential pair is connected to an inversion input terminal 70 so that an inversion input signal is input to the gate. Moreover, the gate of the other-hand MOS transistor M42 constituting the differential pair is connected to a non-inversion input terminal 71 so that a non-inversion input signal is input to the gate.

Sources of the MOS transistors M41 and M42 are connected in common and the common connection portion is connected to the drain of the MOS transistor M40. Moreover, drains of the MOS transistors M41 and M42 are connected to corresponding drains of the MOS transistors M43 and M44 constituting a current source and corresponding sources of the MOS transistors M45 and M46 constituting a cascode circuit. Furthermore, sources of the MOS transistors M43 and M44 are connected in common and connected to a terminal 77 to which the power supply voltage Vdd is supplied at the common connection portion. Gates of the MOS transistors M43 and M44 are connected in common and the common connection portion is connected to a bias terminal 73. Gates of the MOS transistors M45 and M46 are connected in common and the common connection portion is connected to a bias terminal 74.

The MOS transistors M47 and M48 constitute a current mirror. That is, gates of the MOS transistors M47 and M48 are connected in common and the common connection portion is connected to the drain of the MOS transistor M47. Moreover, sources of the MOS transistors M47 and M48 are connected in common and a terminal 79 to which the power supply voltage Vss is supplied is connected to the common connection portion.

Moreover, drains of the MOS transistors M47 and M48 are connected to drains of the MOS transistors M45 and M46 to be constituted as a cascode circuit.

The gate of the MOS transistor M40 is connected to a bias terminal 72 so that a predetermined bias voltage is applied to the gate. Moreover, a terminal 79 is connected to source of the MOS transistor 40 so that the power supply voltage Vss is supplied.

The gate of the MOS transistor M50 is connected with the common connection portion between the MOS transistors M46 and M48. Moreover, the MOS transistor M50 is connected to a terminal 79 in which the power supply voltage Vss is supplied to the source of the MOS transistor M50 and the drain of the MOS transistor M50 is connected to an output terminal 76.

The gate of the MOS transistor M49 is connected to a bias terminal 75 so that a predetermined bias voltage is applied to the gate. Moreover, the MOS transistor M49 is connected to a terminal 78 in which a voltage Vdd2 different from the power supply voltage Vdd is supplied to the source of the MOS transistor M49 and the drain of the MOS transistor M49 is connected to the output terminal 76.

Moreover, the resistance R40 and capacitor C40 are connected in series between the common connection portion between the MOS transistors M46 and M48 on one hand and the output terminal on the other and this series circuit forms a phase compensation circuit.

Figure 17:
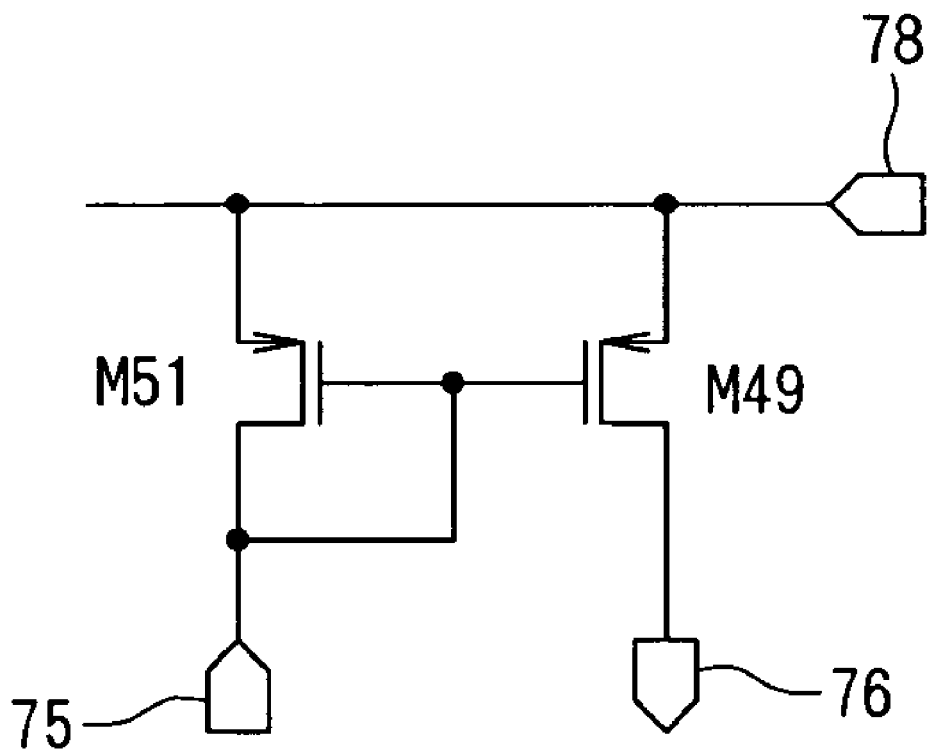
FIG. 17 is a circuit diagram showing a bias generation circuit.

In FIG. 16, an optimum bias voltage to be supplied to the gate terminal of the MOS transistor M49 serving as a current source can be easily generated by a current mirror circuit paired with the M49. FIG. 17 shows a specific circuit of the current mirror circuit.

The MOS transistor M49 is the MOS transistor M49 constituting the output portion 82 in FIG. 16 and a MOS transistor M51 and the MOS transistor M49 constitute a current mirror circuit. By supplying a bias current to the terminal 75, a set current also flows through the MOS transistor M49 in accordance with the function of the current mirror circuit. Another power supply voltage Vdd2 can set an optional value to Vdd by the above circuit configuration.

The differential amplifier thus constituted is theoretically the same except that the terminal 78 for supplying the power supply voltage of the output portion 82 is set separately from the terminal 77 for supplying the power supply voltage of the differential input portion 81.

Moreover, the differential amplifier shown in FIG. 16 can easily expand an output voltage of the power supply of the output portion 82 from Vss to Vdd2 by using Vdd2 which is a voltage higher than Vdd.

Therefore, by replacing the differential amplifier shown in FIG. 16 with the differential amplifier 150 of FIG. 14, it is possible to expand the control range of well voltages of the MOS transistors M2 and M3 of the differential input portion 10 from Vdd to Vdd2.

When constituting an amplifier having the circuit shown in FIG. 16, it is possible to decrease the load of the power supply for generating Vdd2 as a whole compared to a case of supplying Vdd2 like the case of the differential amplifier 150 because the necessary current for Vdd2 is only for output portion.

Moreover, a case is frequent in which a power supply has only one set of the Vss and Vdd on a circuit system. However, because a current flowing through Vdd2 is very small, it is possible to easily form a step-up circuit on the same chip. Thus, by supplying only Vdd from the outside, it is possible to provide a low-voltage operational amplifier having a wide input voltage range.

The example in FIG. 16 is described for a case of outputting a voltage higher than the power supply voltage Vdd. However, when outputting a voltage lower than the power supply voltage Vss, the source of the M26 of the output portion in FIG. 3 is connected to another terminal capable of supplying the Vss2 different from the Vss and moreover, it is possible to supply a bias voltage formed not by the bias terminal 34 but by a current mirror circuit paired with the M26 to the gate of the M26.

What is claimed is:

1. An operational amplifier comprising:
a differential input portion including a differential pair of MOS transistors for inputting a differential signal respectively and a current source for supplying a constant current to said MOS transistors, each of said MOS transistors having a well terminal;
a load portion comprising a MOS transistor pair operating as the load of said differential pair of MOS transistors; and
a well voltage control portion for controlling the well voltage of said differential pair of the MOS transistors to keep constant a source voltage of said differential pair of MOS transistors, said well voltage control portion supplying each of the well terminals with an output signal generated in accordance with a result of a comparison of the source voltage of said differential pair of MOS transistors with a predetermined reference voltage.

2. An operational amplifier comprising:
a first differential input portion including a first differential pair of MOS transistors for inputting a differential signal respectively and a first current source for supplying a constant current to said first differential pair of the MOS transistors, each of said MOS transistors having a well terminal;
a second differential input portion including a second differential pair of MOS transistors for inputting said differential signal and a second current source for supplying a constant current to said second differential pair of MOS transistors, the polarity of said second differential pair of MOS transistors being opposite to the polarity of said first differential pair of MOS transistors;
a summing portion for summing a current from said first differential input portion and said a current from said second differential input portion; and
a well voltage control portion for controlling the well voltage of said first differential pair of the MOS transistors to keep constant a source voltage of said first differential pair of MOS transistors, said well voltage control portion supplying each of the well terminals with an output signal generated in accordance with a result of a comparison of the source voltage of said differential pair of MOS transistors with a predetermined reference voltage.

3. An operational amplifier comprising:
a first differential input portion including a first differential pair of MOS transistors for inputting a differential signal respectively and a first current source for supplying a constant current to said first differential pair of the MOS transistors, each of said first differential pair of MOS transistors having a well terminal;
a second differential input portion including a second differential pair of MOS transistors for inputting said differential signal and a second current source for supplying a constant current to said second differential pair of MOS transistors, the polarity of said second differential pair of MOS transistors being opposite to the polarity of said first differential pair of MOS transistors, each of said second differential pair of MOS transistors having a well terminal;

a summing portion for summing a current from said first differential input portion and said a current from said second differential input portion;

a first well voltage control portion for controlling the well voltage of said first differential pair of the MOS transistors to keep constant a source voltage of said first differential pair of MOS transistors, said well voltage control portion supplying each of the well terminals of said first differential pair of the MOS transistors with an output signal generated in accordance with a result of a comparison of the source voltage of said first differential pair of MOS transistors with a predetermined first reference voltage; and a second well voltage control portion for controlling the well voltage of said second differential pair of the MOS transistors to keep constant a source voltage of said second differential pair of MOS transistors, said well voltage control portion supplying each of the well terminals of said second differential pair of the MOS transistors with an output signal generated in accordance with a result of a comparison of the source voltage of said second differential pair of MOS transistors with a predetermined second reference voltage.

4. An operational amplifier comprising:

a differential input portion including a differential pair of MOS transistors for inputting a differential signal respectively and a current source for supplying a constant current to said MOS transistors, each of said MOS transistors having a well terminal;

a first cascode current source portion including a MOS transistor pair constituting a folded cascode circuit with said differential pair of MOS transistors, a first current source, and a second current source supplying a constant current to said MOS transistor pair respectively;

a second cascode current source portion including a third current source and a fourth current source supplying a constant current to the MOS transistor pair of the first cascode current source portion respectively; and a well voltage control portion for controlling the well voltage of said differential pair of the MOS transistors to keep constant a source voltage of said differential pair of MOS transistors, said well voltage control portion supplying each of the well terminals with an output signal generated in accordance with a result of a comparison of the source voltage of said differential pair of MOS transistors with a predetermined reference voltage.

5. The operational amplifier according to claim 4, wherein either of a set of the first current source and the second current source and a set of the third current source and the fourth current source is constituted as a current mirror.

6. An operational amplifier comprising:

a first differential input portion including a first differential pair of MOS transistors for inputting a differential signal respectively and a current source for supplying a constant current to said MOS transistors, each of said MOS transistors having a well terminal;

a second differential input portion including a second differential pair of MOS transistors for inputting said differential signal and a second current source for supplying a constant current to said second differential pair of MOS transistors, the polarity of said second differential pair of MOS transistors being opposite to the polarity of said first differential pair of MOS transistors;

a summing portion including a first MOS transistor pair constituting a first folded cascode circuit with said first differential pair of MOS transistors, a third current source and a fourth current source supplying a constant current to said first MOS transistor pair respectively, a second MOS transistor pair constituting a second folded cascode circuit with said second differential pair of MOS transistors, and a fifth current source and a sixth current source supplying a constant current to said second MOS transistor pair respectively, in which the first MOS transistor pair constituting the first cascode circuit and the second MOS transistor pair constituting the second cascode circuit are connected in series; and a well voltage control portion for controlling the well voltage of said first differential pair of the MOS transistors to keep constant a source voltage of said first differential pair of MOS transistors, said well voltage control portion supplying each of the well terminals with an output signal generated in accordance with a result of a comparison of the source voltage of said differential pair of MOS transistors with a predetermined reference voltage.

7. An operational amplifier comprising:

a first differential input portion including a first differential pair of MOS transistors for inputting a differential signal respectively and a first current source for supplying a constant current to said first differential pair of MOS transistors, each of said first differential pair of MOS transistors having a well terminal;

a second differential input portion including a second differential pair of MOS transistors for inputting said differential signal and a second current source for supplying a constant current to said second differential pair of MOS transistors, the polarity of said second differential pair of MOS transistors being opposite to the polarity of said first differential pair of MOS transistors, each of said second differential pair of MOS transistors having a well terminal;

a summing portion including a first MOS transistor pair constituting a first folded cascode circuit with said first differential pair of MOS transistors, a third current source and a fourth current source supplying a constant current to said first MOS transistor pair respectively, a second MOS transistor pair constituting a second folded cascode circuit with said second differential pair of MOS transistors, and a fifth current source and a sixth current source supplying a constant current to said second MOS transistor pair respectively, in which the first MOS transistor pair constituting the first cascode circuit and the second MOS transistor pair constituting the second cascode circuit are connected in series;

a first well voltage control portion for controlling the well voltage of said first differential pair of the MOS transistors to keep constant a source voltage of said first differential pair of MOS transistors, said well voltage control portion supplying each of the well terminals of said first differential pair of the MOS transistors with an output signal generated in accordance with a result of a comparison of the source voltage of said first differential pair of MOS transistors with a predetermined first reference voltage; and a second well voltage control portion for controlling the well voltage of said second differential pair of the MOS transistors to keep constant a source voltage of said second differential pair of MOS transistors, said well voltage control portion supplying each of the well terminals of said second differential pair of the MOS transistors with an output signal generated in accordance with a result of a comparison of the source voltage of said second differential pair of MOS transistors with a predetermined second reference voltage.

8. The operational amplifier according to claim 6 or 7, wherein either of a set of the third current source and the fourth current source and a set of the fifth current source and the sixth current source is constituted as a current mirror.

9. The operational amplifier according to any one of claims 1, 2, 3, 4, and 6, wherein both or either of positive or negative power supply voltage which is supplied to said well voltage control portion, said first well voltage control portion, or said second well voltage control portion is higher than a positive voltage supplied to a portion other than said well voltage control portion or is lower than the negative voltage supplied a portion other than said well voltage control portion.

10. The operational amplifier according to claim 9, wherein the well voltage control portion is comprising a differential amplifying portion and an output circuit, and either of positive and negative power supply voltage to be supplied to said output circuit is higher than the positive voltage supplied to a portion other than said output circuit, or is lower than the negative voltage supplied a portion other than said well voltage control portion.

11. The operational amplifier according to claim 9, wherein a voltage which is supplied to said well voltage control portions is generated by a step-up circuit or step-down circuit.

12. The operational amplifier according to claim 10, wherein a voltage which is supplied to said well voltage control portions is generated by a step-up circuit or step-down circuit.

* * * * *